United States Patent [19]
Komatsubara et al.

[11] Patent Number: 5,546,218
[45] Date of Patent: Aug. 13, 1996

[54] DRIVE CIRCUIT OF A SIMICONDUCTOR OPTICAL MODULATOR

[75] Inventors: Shigeo Komatsubara; Satoru Sueyoshi; Hiroshi Kanbayashi, all of Kawasaki, Japan

[73] Assignee: Fujitsu Limited, Kanagawa, Japan

[21] Appl. No.: 405,026

[22] Filed: Mar. 16, 1995

[30] Foreign Application Priority Data

Mar. 18, 1994 [JP] Japan .................................. 6-048846
Jun. 6, 1994 [JP] Japan .................................. 6-122915

[51] Int. Cl.$^6$ ......................................... G02B 26/00
[52] U.S. Cl. ................................... 359/237; 359/248
[58] Field of Search .......................... 359/237, 248, 359/176, 174, 188

[56] References Cited

U.S. PATENT DOCUMENTS 5,394,260  2/1995  Suzuki et al. .................. 359/158

OTHER PUBLICATIONS

"Monolithic Integration of InGaAsP/InP Distributed Feedback Laser and Electro–absorption Modulator by Vapor Phase Epitaxy", Suzuki et al, *Journal of Lightwave Technology*, vol. LT-5, No. 9, Sep. 1987, pp. 1277–1285.

"Electrical and Optical Interactions Between Integrated InGaAsP/InP DFB Lasers and Electroabsorption Modulators", Suzuki et al, *Journal of Lightwave Technology*, vol. 6, No. 6, Jun. 1988, pp. 779–785.

"Monolithic Electro–absorption Modulator/DFB Laser Light Source", Soda et al, OQE89–30, pp. 31–36.

*Primary Examiner*—Mark Hellner
*Attorney, Agent, or Firm*—Nikaido Marmelstein Murray & Oram LLP

[57] ABSTRACT

A circuit for driving a semiconductor optical modulator which has a first semiconductor layer having a first conduction type, a second semiconductor layer having a second conduction type, and a modulation active layer sandwiched with the first and second semiconductor layers, wherein the semiconductor optical modulator modulates light emission from a semiconductor laser diode having at least a third semiconductor layer having the first conductivity type, the third semiconductor layer which is electrically connected to the first semiconductor layer of the semiconductor optical modulator, the driving circuit is provided with an output circuit for outputting a drive signal to the semiconductor optical modulator based on a signal for optical modulation inputted from the outside, and a compensation circuit for regulating a resistance of bypass channel of current passing in the semiconductor optical modulator by a drive signal of the output circuit based on the signal for optical modulation and compensating a voltage level of the drive signal to be constant.

29 Claims, 18 Drawing Sheets

1

DRIVE CIRCUIT OF A SIMICONDUCTOR OPTICAL MODULATOR

BACKGROUND OF THE INVENTION

1. Field of the Invention

The present invention relates to a drive circuit for providing the excitation to an optical modulator of a modulator-integrate distributed-feedback laser diode (hereinafter simply referred to as an MI-DFB laser diode) for the use in a repeater or the like for optical communication.

2. Description of the Prior Art

With the requirements for long-distance transmission and larger capacity of an optical communication system, transmission characteristics of 100 Km or more and 2.5 Gb/s have been required. In order to meet such requirements, a modulator,integrate distributed-feedback laser diode in which a laser diode of a direct modulation system or an electro-absorption type optical modulator and a DFB laser diode are integrated has been researched and developed, and a circuit for driving the relevant light-emitting element is being developed in keeping with the above.

Here, a drive circuit for driving a laser diode of a direct modulation system according to a prior art of the present invention will be described. As shown in FIG. 1, this drive circuit is provided with an input buffer 1A for amplifying a signal required for direct modulation (hereinafter referred to as a modulation signal) and a differential amplifier 1B for receiving reference voltage VREF and a modulation signal SIN and outputting drive voltage Vm.

The differential amplifier 1B has a first to a fourth field effect transistors TN1 to TN4 as shown in FIG. 2. In the first field effect transistor TN1, the drain thereof is connected to a ground line GND and the reference voltage VREF is supplied to the gate thereof. In the second field effect transistor TN2, the drain thereof is connected to one end of a laser diode 2, the source thereof is connected to the source of the first field effect transistor TN1, and the modulation signal SIN is supplied to the gate thereof. In the third field effect transistor TN3, the drain thereof is connected to respective sources of the first and second field effect transistors TN1 and TN2, the source thereof is connected to a power supply line VSS, and bias voltage VIP is supplied to the gate thereof.

In the fourth field effect transistor TN4, the drain thereof is connected to the drain of the second field effect transistor TN2, and the source thereof is connected to the power supply line VSS. The fourth field effect transistor TN4 as functions as a bias element for making the laser diode 2 emit light stably, and bias voltage VIB is supplied-to the gate thereof. The bias voltage VIB is supplied, since the device circuit current of the laser diode 2 differs due to manufacturing dispersion of the element, for the purpose of regulating the current. Besides, the device circuit from the laser diode 2, and this device circuit current is referred to as an oscillation threshold current in the laser diode 2 of a direct modulation system.

Next, the Operation of the relevant drive circuit will be described. First, when the modulation signal is amplified by the input buffer 1A and the amplified modulation signal SIN is outputted to the differential amplifier 1B, a drive current based on a signal of the difference between the reference voltage VREF and the modulation signal SIN passes to the laser diode 2 by the differential amplifier 1B operated based on the bias voltage VIP. For example, when the modulation signal SIN is at an "H" (high) level, the second field effect transistor TN2 is turned ON, and a drive current passes to the laser diode 2. With this, a laser light is outputted outside from the relevant element 2. When SIN is at an "L" (low) level on the contrary, the second field effect transistor TN2 is turned OFF. Hence, no drive current passes to the laser diode 2, but the laser light is not oscillated.

Now, according to a related art of the present invention, an MI-DFB laser diode of an external modulation system of less power consumption as compared with the laser diode 2 of a direct modulation system has been developed, and a circuit for driving this laser diode is being demanded.

The MI-DFB laser diode is described in M. Suzuki et al. "Monolithic Integration of InGaAsP/InP Distributed Feedback Laser and Electroabsorption Modulator by Vapor Phase Epitaxy: JOURNAL OF LIGHTWAVE TECHNOLOGY, VOL. LT-5, NO.9, SEPTEMBER 1987", and is an element obtained by integrating an optical modulator and a DFB laser diode as a multi-giga-bit optical transmission system. The DFB laser diode is for generating a laser light, and the optical modulator is for controlling the external output of the laser light by absorbing or transmitting a laser light generated by the laser diode. Such MI-DFB laser diode is capable of driving at a high speed with a small-size, high output and low voltage, and the application thereof is being expected.

Next, a case when the drive circuit of the laser diode 2 of a direct modulation system is applied to the MI-DFB laser diode will be described. First, as shown in FIG. 3, one end of an outside resistance RL and an electrode (P side) for the optical modulator of the MI-DFB laser diode 3 are connected to the drain of the second field effect transistor TN2, respectively, and another end of the resistance RL is connected to a ground line GND. The electrode (P side) for a laser oscillation of the laser diode 3A is connected to a power supply line VCC through a constant current source 4, and the source of a third field effect transistor TN3 is connected to a power supply line VSS at approximately −5 V. The resistance RL is connected for the purpose of voltage-driving of the optical modulator 3B. Each electrode of N side thereof are connected to a ground line GND.

Here, the operation of this drive circuit such a shown in FIG. 3 will be described. First, when the modulation signal SIN shows an "H" (high) level in a state that laser diode 3A is oscillating, the second field effect transistor TN2 is turned ON, and a current I passes in a resistance RL. At this time drive voltage Vm becomes approximately −3 V, which is supplied to the optical modulator 3B as reveres bias voltage. A device circuit current Imod passes to the drive circuit from the optical modulator 3B at this time. The current I passing in the load resistance RL passes into the third field effect transistor TN3 through the second field effect transistor TN2, and the current Imod passes into the fourth field effect transistor TN4. With this, the laser light emitted from the inside of the laser diode 3A is absorbed by an electric field in the optical modulator 3B, and the output light to the outside is intercepted.

On the contrary, when the modulation signal SIN shows an "L" (low) level, the second field effect transistor TN2 is turned OFF, and the current I in the resistance RL becomes zero. At this time the drive voltage Vm also becomes 0 V, and the current Imod passes into the fourth field effect transistor TN4 from the optical modulator 3B. Since the reverse bias voltage is not applied to the optical modulator 3B at this time, the laser light emitted from the laser diode 3A passes through without being absorbed by the electric field in the optical modulator 3B and is outputted outside.

However, the currents Imod of the laser diode 2 and the MI-DFB laser diode 3 are different from each other as shown in FIG. 4. In FIG. 4, the axis of ordinates represents the current Imod, and the axis of abscissas represents the modulation signal SIN, respectively. A dashed line shows the current Imod of the laser diode 2 for the modulation signal SIN of the differential amplifier 1B, and a solid line shows the current Imod of the MI-DFB laser diode 3 for the signal SIN, respectively.

According to the foregoing, as against that the current Imod of the laser diode 2 of a direct modulation system is constant, the current Imod when the modulation signal SIN is at an "H" level and the current Imod when the modulation signal SIN is at an "L" level are different from each other in the case of the MI-DFB laser diode 3 of an external modulation system. Such a phenomenon has been confirmed by the present inventor et al., and is considered as wrap-around of a DC current into the optical modulator 3B from the constant current source 4 for driving the laser diode 3A.

In a method that the drive circuit of the laser diode 2 is applied to the MI-DFB laser diode 3 as it is and the gate of the fourth field effect transistor TN4 is biased fixedly by the bias voltage VIB, there is such a problem that the regulation of the current Imod corresponding to the modulation signal= "H" or "L" level becomes incomplete, and a noise is contained in an output waveform or the laser light becomes unstable due to the fact that the drive voltage (drive signal) Vm undergoes a change.

Thus, such a laser driver that is structured so as to sufficient for driving the optical modulator 3B of the laser diode 3 and is capable of controlling the optical output of the laser diode 3 with high precision is demanded.

SUMMARY OF THE INVENTION

It is an object of the present invention to provide a drive circuit for a semiconductor optical modulation in which, without fixing a resistance of a bypass channel of current passing in a semiconductor optical modulator, the resistance value is regulated flexibly so as to keep the drive voltage constant, thus making it possible to stabilize optical modulation.

A first circuit for driving a semiconductor optical modulator which has a first semiconductor layer having a first conduction type, a second semiconductor layer having a second conduction type, and a modulation active layer sandwiched with the first and second semiconductor layers, wherein the semiconductor optical modulator modulates light emission from a semiconductor laser diode having at least a third semiconductor layer having the first conductivity type, the third semiconductor layer which is electrically connected to the first semiconductor layer of the semiconductor optical modulator, the driving circuit in according to the present invention is provided with an output circuit for outputting a drive signal to the semiconductor optical modulator based on a signal for optical modulation inputted from the outside and a compensation circuit for regulating a resistance of bypass channel of current passing in the semiconductor optical modulator by a drive signal of the output circuit based on the signal for optical modulation and compensating a voltage level of the drive signal to be constant as shown a first preferred embodiment.

According to such first drive circuit as described above, since the output voltage (drive signal) of the output circuit is regulated by the compensation circuit, the drive signal of the semiconductor optical modulator is optimized, thus making it possible to generate stable laser light from the light emitting element.

With this, there is provided a circuit for driving, when the signal for optical modulation is a digital signal, a semiconductor optical modulator in which a current passing when the signal is at an "H" level and a current passing when the signal is at an "L" level are different from each other in an optimum manner.

In the present invention, the output circuit is constituted a first differential amplifier, the drive voltage is outputted to the semiconductor optical modulator from a first differential amplifier inputted with the signal for optical modulation and the reference voltage. Furthermore, the compensating circuit is constituted a second differential amplifier, that inputted with the signal for optical modulation and the reference voltage bypasses the current passing in the semiconductor optical modulator, and the drive voltage from the output circuit, and regulated to a constant value in accordance therewith.

A second drive circuit of the present invention is provided with a differential amplifier for outputting a difference signal in accordance with a first control signal for optical modulation of the semiconductor optical modulator and a second control signal obtained by inverting the first control signal, and an output circuit for generating drive voltage in accordance with the difference signal from the differential amplifier and outputting the drive voltage to the semiconductor optical modulator as shown a second preferred embodiment.

According to such second drive circuit, two voltages having a large voltage difference are obtainable as the drive voltage using a control signal composed of a binary signal. As a result, voltage at an "H" level and voltage at an "L" level sufficient for driving the module of the semiconductor optical modulator are obtainable, thus making it possible to control an optical output of the semiconductor optical modulator with high precision.

A third drive circuit of the present invention is provided with a differential amplifier for outputting a first and a second difference signals in accordance with a first control signal for optical modulation of the semiconductor optical modulator and a second control signal obtained by inverting the first control signal, a first source follower circuit for outputting a non-inverted output signal in accordance with the first difference signal from the differential amplifier, a second source follower circuit for outputting an inverted output signal in accordance with the second difference signal from the differential amplifier, and a push-pull circuit for generating drive voltage in accordance with a non-inverted output signal from the first source follower circuit and an inverted output signal from the second source follower circuit and outputting the drive voltage to the semiconductor optical modulator as shown a third preferred embodiment.

According to such third drive circuit, two voltages having a voltage difference larger than the second drive circuit are obtainable as the drive voltage using the first and the second control signals. As a result, voltage at an "H" level and voltage at an "L" level sufficient for driving the module of the semiconductor optical modulator are obtainable, thus making it possible to control the optical output of the semiconductor optical modulator with high precision.

A fourth drive circuit of the present invention is provided with a first source follower circuit for outputting a non-inverted output signal and an inverted output signal in accordance with a first control signal for optical modulation of the semiconductor optical modulator, a second source follower circuit for outputting a non-inverted output signal and an inverted output signal in accordance with a second control signal obtained by inverting the first control signal, a first differential amplifier for outputting a first voltage in accordance with respective non-inverted output signals from the first and the second source follower circuits, a second differential amplifier for outputting a second voltage in accordance with respective inverted output signals from the first and the second source follower circuits, and a push-pull circuit for generating drive voltage in accordance with the first and the second output voltages from the first and the second differential amplifiers and outputting the drive voltage to the semiconductor optical modulator as shown a fourth preferred embodiment.

According to such fourth drive circuit, two voltages having a voltage difference larger than the second and the third drive circuits as the drive voltage are obtainable using the first and the second control signals. As a result, voltage at an "H" level and voltage at an "L" level sufficient for driving the module of the semiconductor optical modulator are obtainable, thus making it possible to control the optical output of the semiconductor optical modulator with high precision.

With this, there is provided an optimum drive circuit for a semiconductor optical modulator in which transmission characteristics of 100 Km or longer and 2.5 Gb/s are expected, which contributes to improvement of an optical communication system of long-distance transmission and large capacity.

DESCRIPTION OF THE PREFERRED EMBODIMENTS

Figure 1:
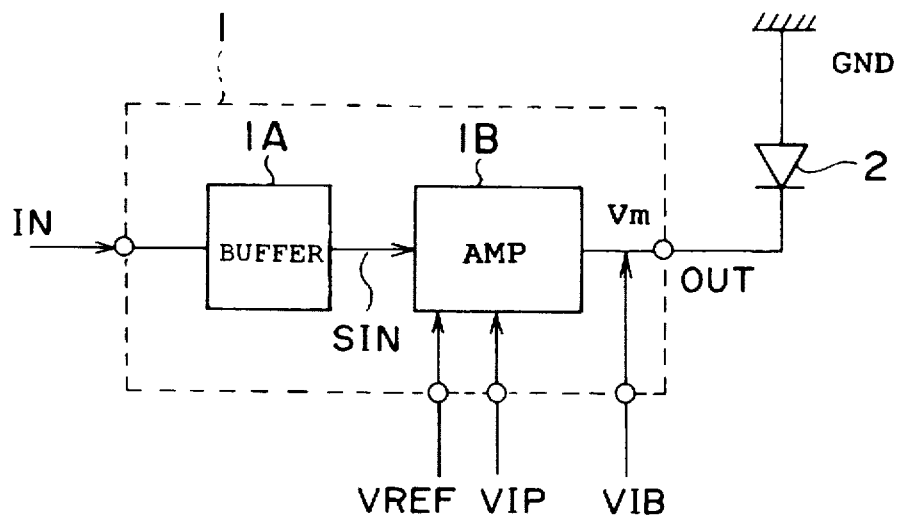
FIG. 1 is a block diagram showing a drive circuit of a laser diode of a direct modulation system according to the related art of the present invention.
Figure 2:
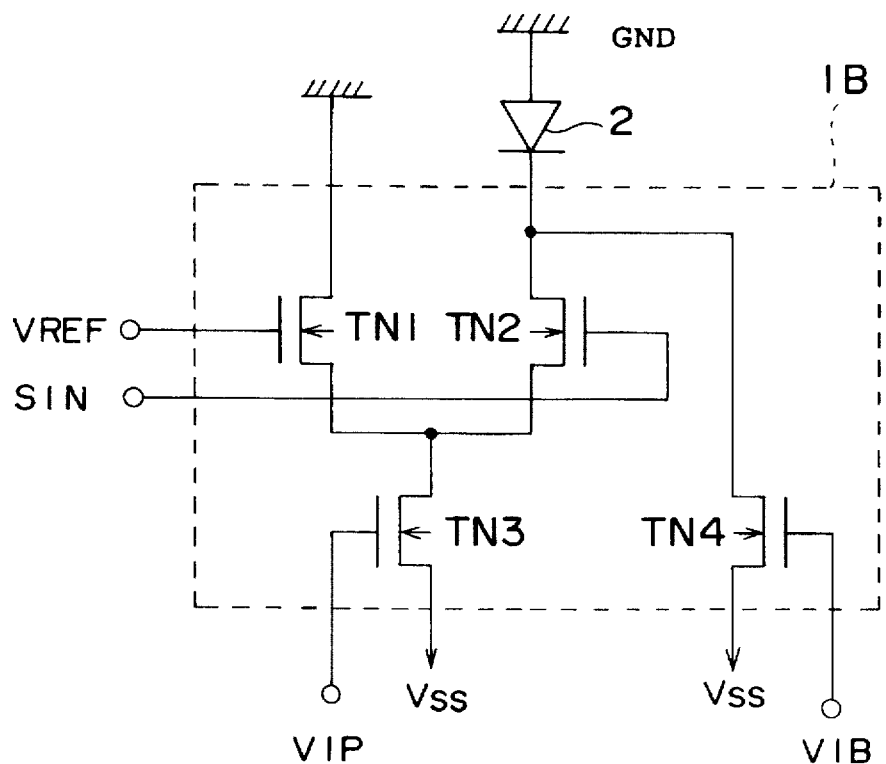
FIG. 2 is a block diagram of a differential amplifier used in the drive circuit shown in FIG. 1.
Figure 3:
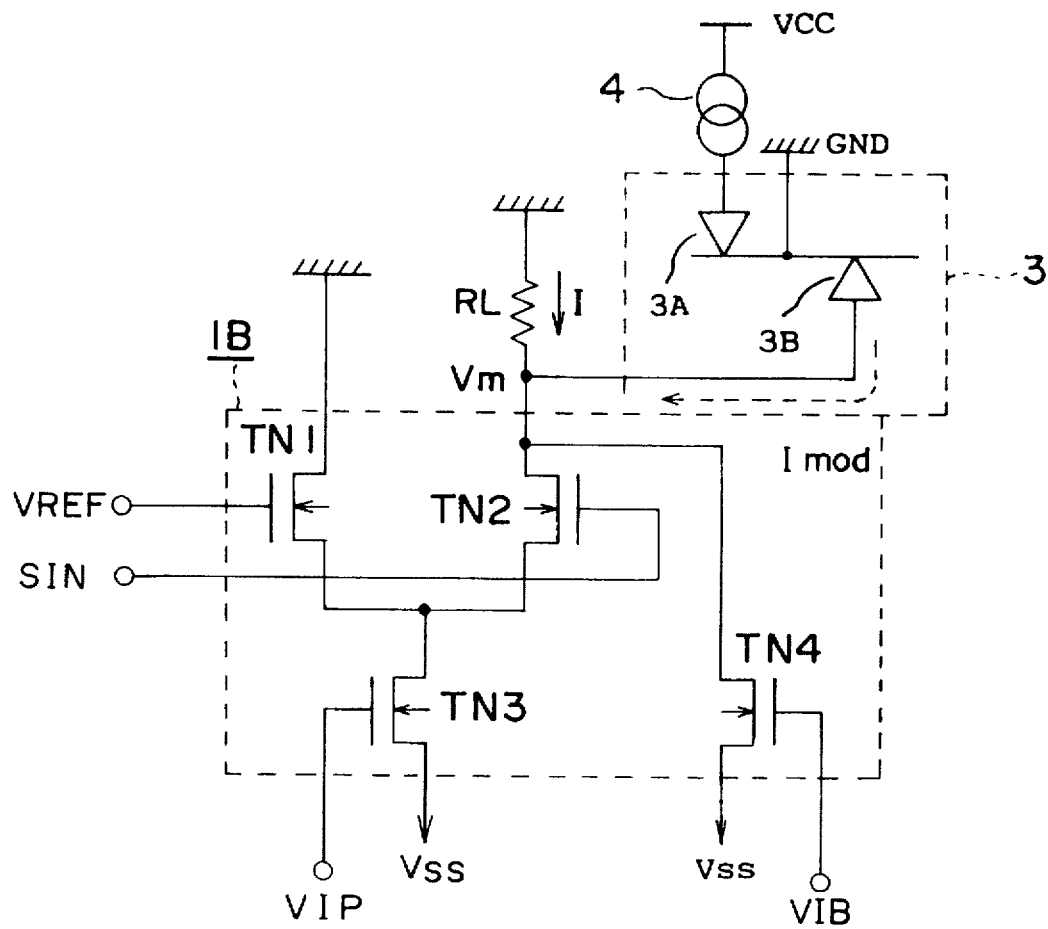
FIG. 3 is a block diagram in which the differential amplifier shown in FIG. 2 is adapted for driving a semiconductor optical modulator.
Figure 4:
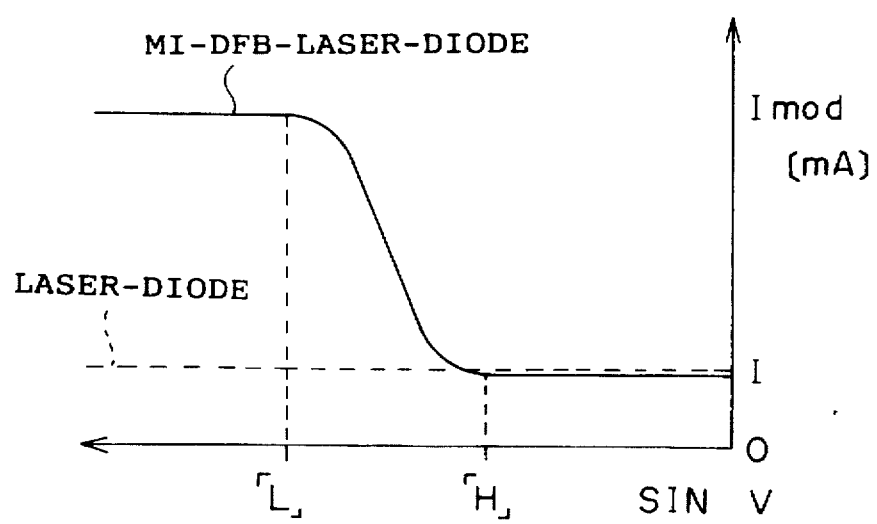
FIG. 4 is a comparison diagram of an current between the laser diode shown in FIG. 1 and the semiconductor optical modulator shown in FIG. 3.
Figure 5:
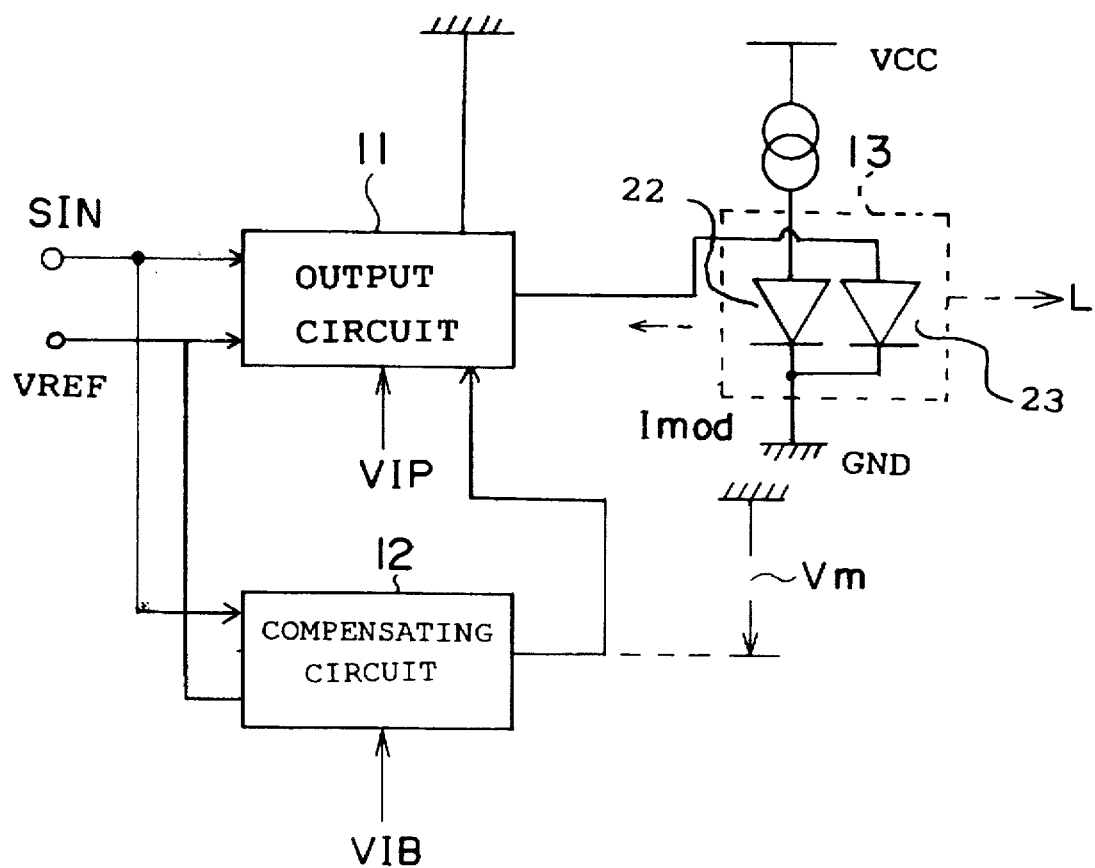
FIG. 5 is a block diagram of a first drive circuit of a semiconductor optical modulator in according to the present invention.

A first circuit for driving a semiconductor optical modulator which has a first semiconductor layer having a first conduction type, a second semiconductor layer having a second conduction type, and a modulation active layer sandwiched with the first and second semiconductor layers, wherein the semiconductor optical modulator modulates light emission from a semiconductor laser diode having at least a third semiconductor layer having the first conductivity type, the third semiconductor layer which is electrically connected to the first semiconductor layer of the semiconductor optical modulator, the driving circuit in according to the present invention is provided with an output circuit 11 for outputting a drive signal to the semiconductor optical modulator based on a signal for optical modulation inputted from the outside and a compensation circuit 12 for regulating a resistance of bypass channel of current passing in the semiconductor optical modulator by a drive signal of the output circuit based on the signal for optical modulation and compensating a voltage level of the drive signal to be constant as shown FIG. 5.

According to such a drive circuit, even though the current passing out of the semiconductor optical modulator 23 differs depending on a case that the drive signal is at an "H" (high) level and a case that it is at an "L" (low) level, the voltage Vm of the drive signal is compensated to be constant by the compensation circuit 12. Thus, the optical modulating operation of the semiconductor optical modulator becomes stable.

In the present invention, the output circuit 11 constitutes a first differential amplifier, and this differential amplifier 11 receives the signal SIN for optical modulation and the reference voltage VREF and generates the drive voltage Vm, and outputs the drive voltage Vm to the semiconductor optical modulator 23.

Figure 6A:
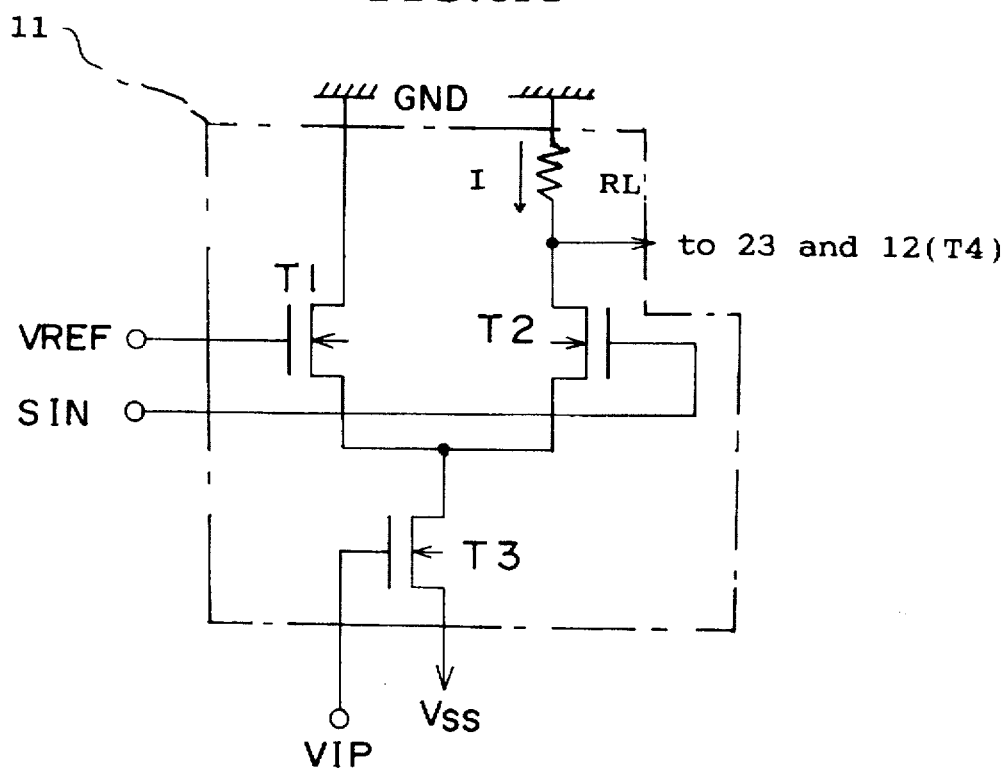
FIG. 6A is an internal circuit diagram of an output circuit of the drive circuit shown in FIG. 5.

As shown in FIG. 6A, this differential amplifier 11 has a first load element RL connected to a power supply line GND at one end thereof, a first transistor T1 with the drain thereof connected to the first power supply line GND, a second transistor T2 with the drain thereof connected to another end of the load element RL and one end of the semiconductor optical modulator 23, respectively, and with the source thereof connected to the source of the first transistor T1, and a third transistor T3 with the drain thereof connected to respective sources of the first and the second transistors T1 and T2 and with the source thereof connected to a second power supply line VSS, respectively.

Figure 6B:
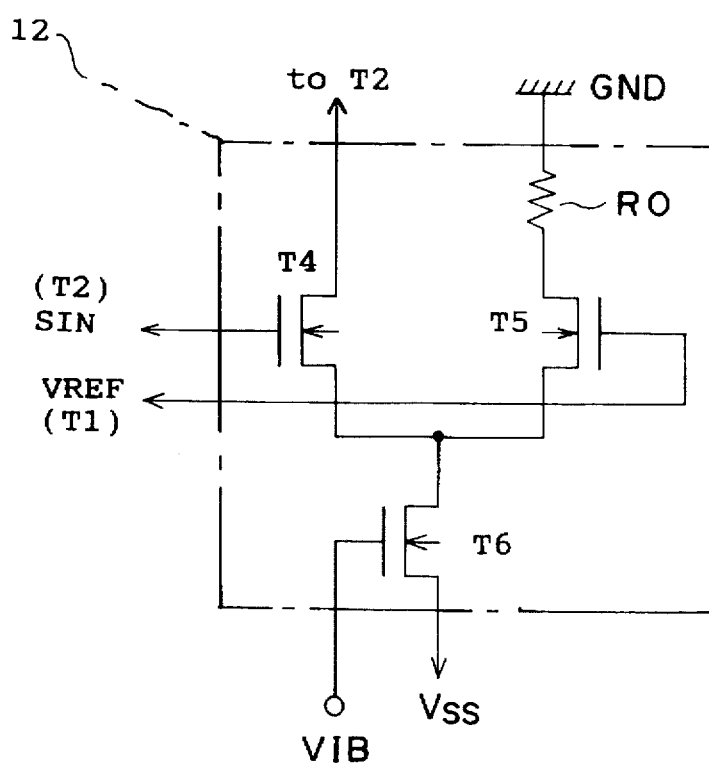
FIG. 6B is an internal circuit diagram of a compensation circuit of the drive circuit shown in FIG. 5.

In the present invention, the compensating circuit 12 constitutes a second differential amplifier, and this differential amplifier 12 receives the signal SIN for optical modulation and the reference voltage VREF and bypasses an current Imod passing in the semiconductor optical modulator 23 in accordance with the signal SIN for optical modulation. As shown in FIG. 6B, this differential amplifier 12 has a fourth transistor T4 with the gate thereof connected to the gate of the second transistor T2 and with the drain thereof connected to the drain of the second transistor T2, respectively, a second load element R0 connected to the first power supply line GND at one end, a fifth transistor T5 with the drain thereof connected to another end of the load element R0 and with the source thereof connected to the source of the fourth transistor T4, respectively, and a sixth transistor T6 with the drain thereof connected to respective sources of the fourth and the fifth transistors T4 and T5 and with the source thereof connected to the second power supply line VSS, respectively.

Further, as shown in FIG. 6A and FIG. 6B, the reference voltage VREF for optical modulation is supplied to respective gates of the first and the fifth transistors T1 and T5, the signal SIN for optical modulation is supplied to respective gates of the second and the fourth transistors T2 and T4, and bias voltages VIP and VIB for determining a working current of the circuit are supplied to respective gates of the third and the sixth transistors T3 and T6, respectively. The gate width of the fifth transistor T5 is made narrower than the gate width of the fourth transistor T4.

Next, the operation of the first drive circuit in according to the present invention will be described. In FIG. 5, the difference signal between the reference voltage VREF and the signal SIN required for modulation is amplified by the output circuit 11 operated based on the first bias voltage VIP. As a result, the drive voltage Vm is generated across the load element RL, and is supplied to the semiconductor optical modulator 23 stably. At this time, the current passing in the semiconductor optical modulator 23 is bypassed in accordance with the reference voltage VREF and the signal SIN for optical modulation by means of the compensation circuit 12 operated based on the second bias voltage VIB, thus regulating the drive voltage Vm from the output circuit 11.

As a result, even when the current Imod of the semiconductor optical modulator 23 when the signal SIN for optical modulation is at an "H" level and the current Imod when the signal SIN is at an "L" level are different from each other, the fluctuation of the drive voltage Vm is controlled by the compensation circuit 12 based on the signal SIN, thus making it possible to supply stabilized drive voltage Vm to the semiconductor optical modulator 23 without including noises in an output waveform.

Further detailed operation will be described hereinafter. When the signal SIN shows an "H" level, first, the second transistor T2 such as shown in FIG. 6A is turned ON, and a current I passes in the resistance RL. At this time, the drive voltage Vm is generated across the load element RL, and the current Imod passes in the semiconductor optical modulator 23. The current I passes into the third transistor T3 through the second transistor T2, and the current Imod passes into the fourth transistor T4 such as shown in FIG. 6B. With this, the laser light emitted from the inside of an laser diode absorbed by an electric field in the optical modulator 23, and the output light to the outside is intercepted.

On the contrary, when the signal SIN for optical modulation shows an "L" level, the second transistor T2 is turned OFF, the fourth transistor T4 is turned OFF, and the current I does not pass in the resistance RL. At this time, the drive voltage Vm becomes 0 V. Further, the current Imod passes in the semiconductor optical modulator 23, but this current Imod passes into the transistor T4.

This is because of such a reason that the current Imod is drawn into the transistor T4 even when the signal SIN for optical modulation shows an "L" level due to the fact that the fourth transistor T4 is not turned OFF completely since the size of the transistor T4 is made larger than the size of the transistor T5, but the off-resistance thereof increases as compared with the on-resistance. The off-resistance of the transistor T4 shows a value in a degree of applying the current Imod from the semiconductor optical modulator 23.

As a result, since the laser light emitted from the laser diode passes through without being absorbed by the electric field in the semiconductor optical modulator 23 and is outputted outside. Due to the fact that the current Imod of the semiconductor optical modulator 23 is bypassed fluidly by the fourth transistor T4 corresponding to the "H" level or the "L" level of the signal SIN for optical modulation as described above, the fluctuation of the drive voltage Vm is controlled, and stabilized drive voltage is supplied to the optical modulator of the semiconductor optical modulator 23 without including noises in the output waveform. As a result, it is possible to Generate a stable laser light from the semiconductor optical modulator 23.

With this, there is provided a drive circuit optimum for a semiconductor optical modulator in which transmission characteristics of 100 Km or longer and 2.5 Gb/s are expected, which contributes to the improvement of reliability of an optical communication system of long-distance transmission and large capacity.

Figure 7:
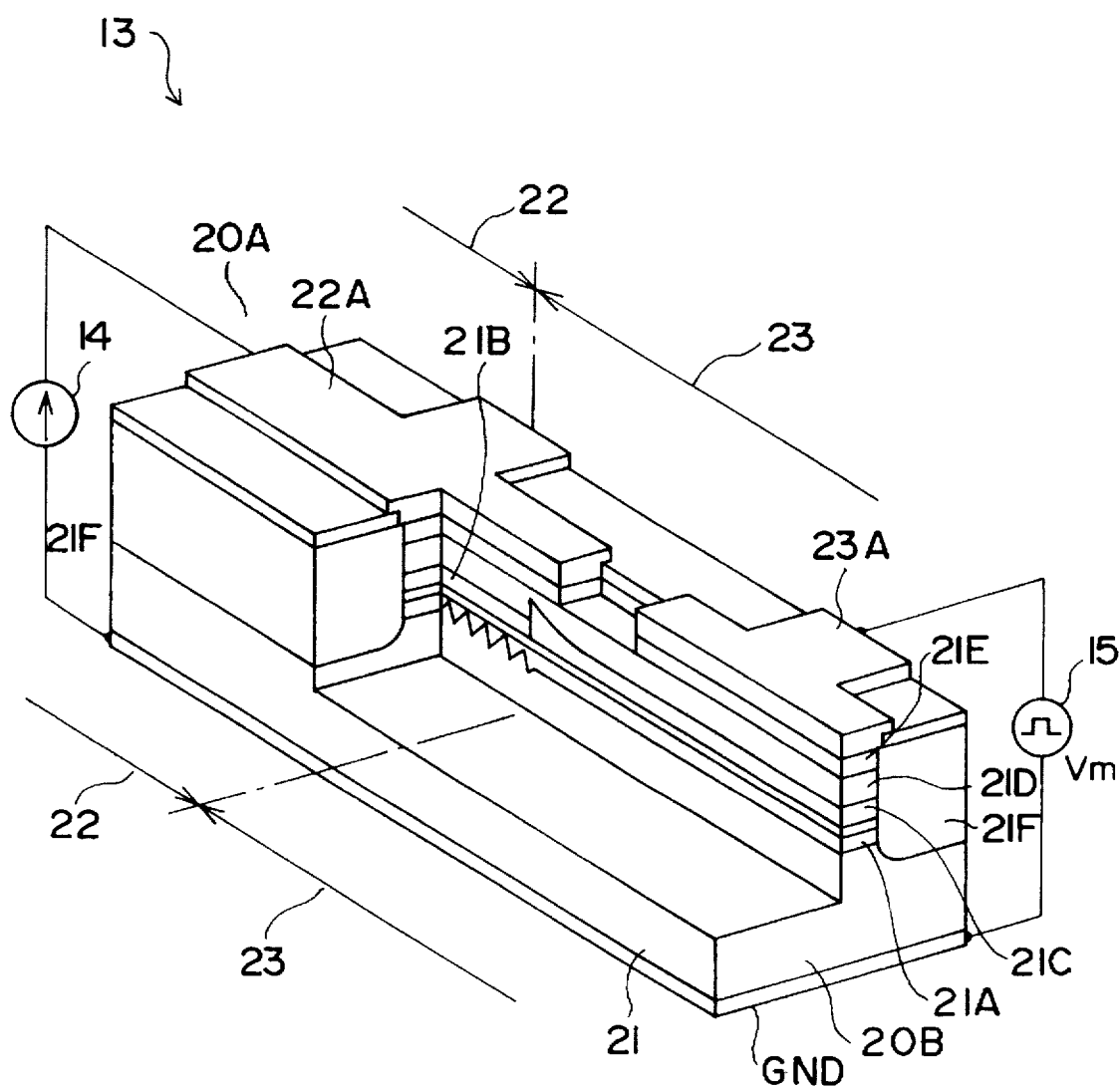
FIG. 7 is a perspective view of a modulator-integrate distributed-feedback laser diode operated by driving circuits according to respective preferred embodiments of the present invention.

Next, respective preferred embodiments of the present invention will be described with reference to the drawings.
The first embodiment In a modulator-integrate distributed-feedback laser diode (hereinafter referred to as an MI-DFB laser diode) 13 applied with a drive circuit such as shown in FIG. 5, a DFB laser light emitting element 22 and an optical modulator 23 are provided integrally on the same n-InP substrate 21, and a laser electrode 22A and an electrode 23A for optical modulation are provided on respective elements 22 and 23 as shown in FIG. 7.

The DFB laser light emitting element 22 generates a laser light having a wavelength of 1.55 μm, and is formed of an n-InGaAsP guide layer 21A, an InGaP active layer 21B, a p-InGaAsP clad layer 21D and a p-InGaAsP contact layer 21E laminated one upon another on an n-InP substrate 21.

There is provided a cleavage plane or a high-reflective coating 20A on an end face of the laser light emitting element 22. The laser electrode 22A provided on the relevant element 22 is for supplying a current for generating a laser light. The electrode 22A is connected to a constant current source (a DC current source) 14 in use.

The optical modulator 23 is for modulating a laser light, and is provided by being connected optically to the laser light emitting element 22 on the same n-InP substrate 21. The optical modulator 23 is formed of an n-InGaAsP guide layer 21A, an InGaP absorbing layer 21C, a p-InGaAsP clad layer 21D and a p-InGaAsP contact layer 21E laminated one upon another on the n-InP substrate 21. High-resistance buried layers 21F are provided on both sides of the active layer 21B and the absorbing layer 21C.

There is provided an anti-reflective coating 20B on the end face of the optical modulator 23. The electrode 23A for optical modulation provided on the optical modulator 23 is for supplying a signal for laser modulation (a modulation signal). In the embodiment of the present invention, the drive voltage Vm such as described with reference to FIG. 5 is supplied to the electrode 23A in use.

Figure 8:
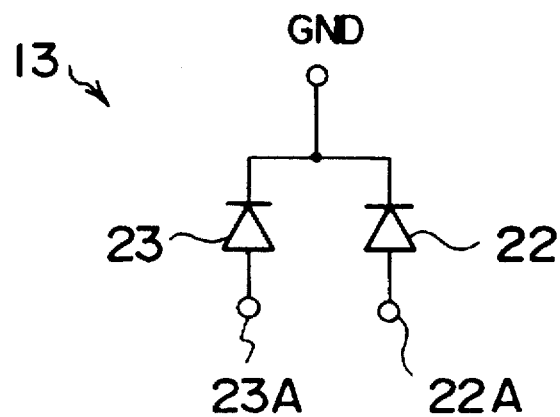
FIG. 8 is an equivalent circuit diagram of the modulator-integrate distributed-feedback laser diode shown in FIG. 7.

Such MI-DFB laser diode 13 will be described with reference to an equivalent circuit in which the laser light emitting element 22 and the optical modulator 23 are connected as shown in FIG. 8 or an equivalent circuit shown in FIG. 5.

Figure 9:
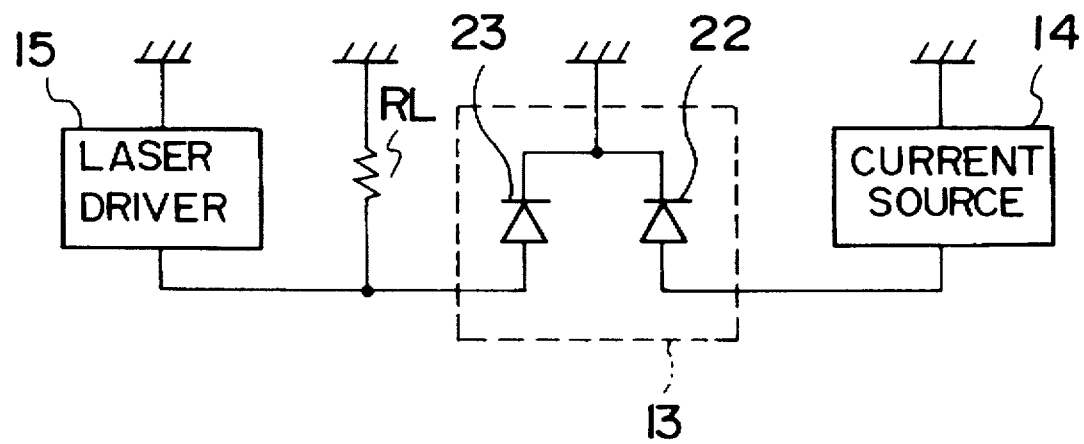
FIG. 9 shows a circuit diagram for explaining a method of driving the modulator-integrate distributed-feedback laser diode shown in FIG. 7.

When the MI-DFB laser diode 13 is driven with modulation, a modulation drive circuit is constituted by connecting an outside resistance RL to a drive circuit (hereinafter referred to as a laser driver) 15 and connecting a DC current source 14 for generating laser light to a DFB laser light emitting element 22 as shown in FIG. 9. Further, the value of the device circuit current Imod passing out of the optical modulator 23 is different depending on the "H" level and the "L" level of signal outputted from the laser driver in such a MI-DFB laser diode 13. Here, it is assumed that the current passing out of the optical modulator 23 when the signal is at an "H" level is Imod1, and the current passing out of the optical modulator 23 when the signal is at an "L" level is Imod2. Thus, such a laser driver that makes the value of the current passing to the optical modulator 23 constant in accordance with the "H" or "L" level of the input signal is constituted.

Figure 10:
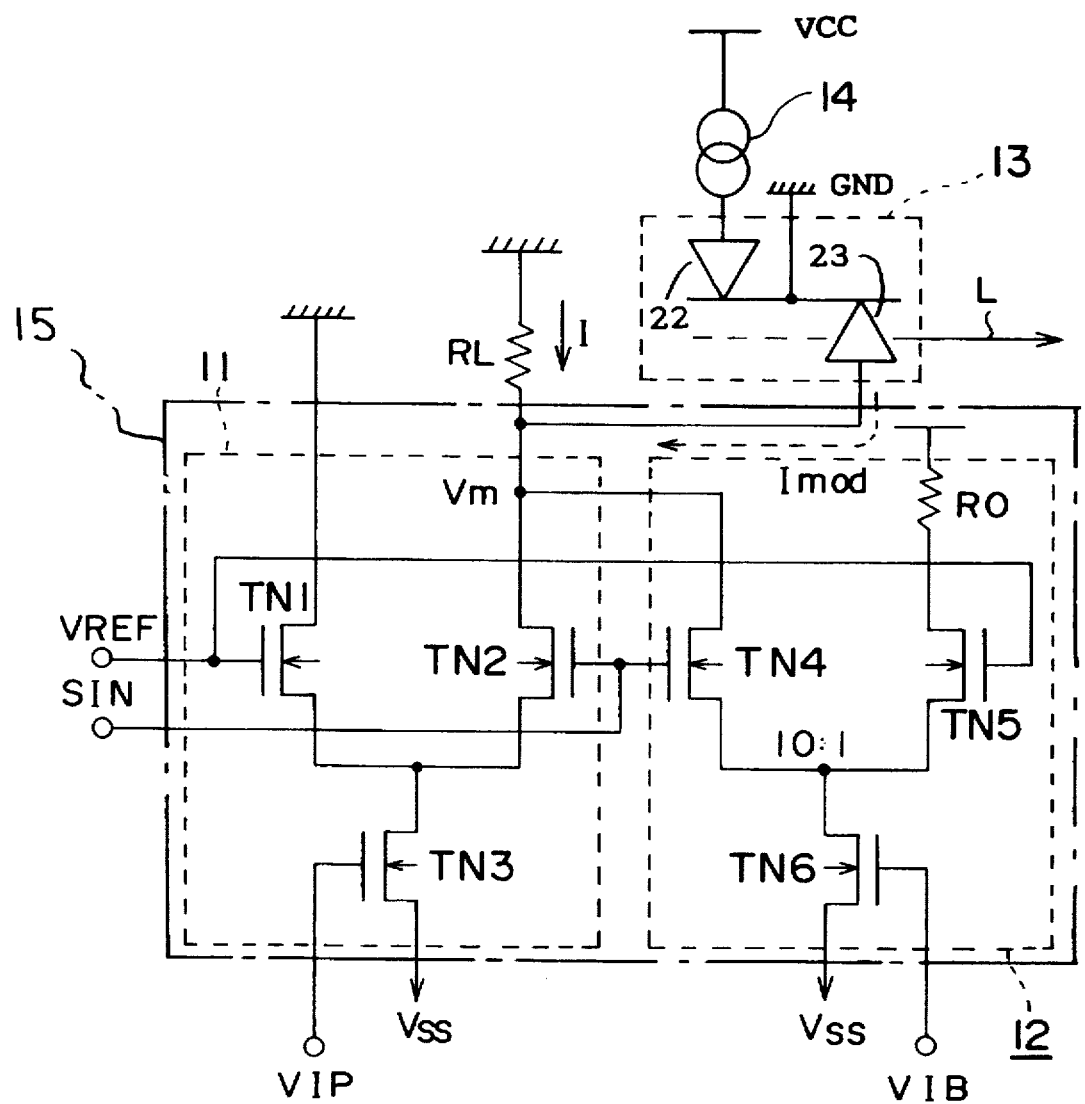
FIG. 10 is a block diagram of a drive circuit of a modulator-integrate distributed-feedback laser diode according to a first preferred embodiment of the present invention.

As shown in FIG. 10, the laser driver 15 is provided with a differential amplifier 11 for generating the drive voltage Vm for optical modulation and outputting the drive voltage Vm to the MI-DFB laser diode 13, and a differential amplifier 12 for regulating the drive voltage Vm from the differential amplifier 11 in accordance with the current passing in this diode 13.

The differential amplifier 11 is an example of the output circuit shown in FIG. 5, which is formed of transistors TN1 to TN3, amplifies the difference signal between the reference voltage VREF and the signal SIN for optical modulation so as to generate the drive voltage Vm, and outputs the drive voltage Vm to the MI-DFB laser diode 13. The working current of the differential amplifier 11 is determined based on the bias voltage VIP.

The transistor TN1 is an example of the first transistor T1 shown in FIG. 6A, and is formed of an n-type field effect transistor. The drain of the transistor TN1 is connected to the ground line GND, the gate thereof is connected to the reference voltage line, and the reference voltage VREF is supplied to the gate. The source of the transistor TN1 is connected to the source of the transistor TN2 and the drain of the transistor TN3, respectively.

The transistor TN2 is an example of the second transistor T2 shown in FIG. 6A, and is formed of an n-type field effect transistor. The drain of the transistor TN2 is connected to one end of the outside resistance RL, the gate thereof is connected to the signal line for optical modulation, and the modulation signal SIN is supplied to the gate thereof.

The transistor TN3 is an example of the third transistor T3 shown in FIG. 6A, and is formed of an n-type field effect transistor. The source of the transistor TN3 is connected to the power supply line VSS, and the gate thereof is connected to a supply source of the bias voltage VIP. These transistors TN1 to TN3 may be constituted of a compound semiconductor such as a GaAs MES transistor.

The outside resistance RL is an example of the first load element, and is an element for driving with voltage the MI-DFB laser diode 13. In the embodiment of the present invention, the outside resistance RL is connected to an external terminal of the IC forming the laser driver 15 in use. The resistance value is set to approximately 50 Ω, and impedance matching is obtained for the diode 13.

The differential amplifier 12 is an example of the compensating circuit shown in FIG. 5. It is constituted of the transistors TN4 to TN5 and the resistance R0, and receives the reference voltage VREF and the signal SIN for optical modulation and regulates the drive voltage Vm from the differential amplifier 11 in accordance with the bias current Imod passing in the MI-DFB laser diode 13. The working current of the differential amplifier 12 is determined based on the bias voltage VIB.

The resistance R0 is an example of the second load element, and is connected for obtaining balance with the outside resistance RL. The resistance R0 is provided outside similarly to the resistance RL and is connected to the ground line GND at one end thereof.

The transistor TN4 is an example of the fourth transistor T4 shown in FIG. 6B, and is formed of an n-type field effect transistor. The drain of the transistor TN4 is connected to one end of the resistance RL, the gate thereof is connected to the gate of the transistor T2, and the modulation signal SIN is supplied to the gate thereof. The source of the transistor TN4 is connected to the source of the transistor TN5 and the drain of the transistor TN6, respectively.

The transistor TN5 is an example of the fifth transistor T5 shown in FIG. 6B, and is formed of an n-type field effect transistor. The drain of the transistor TN5 is connected to another end of the resistance R0, the gate thereof is connected to the reference voltage line, and the reference voltage VREF is supplied to the gate thereof.

The transistor TN6 is an example of the sixth transistor T6 shown in FIG. 6B, and is formed of an n-type field effect transistor. The source of the transistor TN6 is connected to the power supply line VSS, and the gate thereof is connected to the supply source of the bias voltage VIB. These transistors TN4 to TN6 may be formed of compound semiconductors such as GaAs MES transistors. The gate width of the transistor TN5 is made narrower than the gate width of the transistor TN4. For example, TN4:TN5 is set to 10:1. With this, the transistor TN4 becomes to show depletion type characteristics, and the conductance of TN4 becomes larger as compared with the conductance of TN5. The reference voltage VREF is supplied to the gate of the transistor TN5, and the modulation signal SIN is supplied to the gate of the transistor TN5, respectively.

Figure 11:
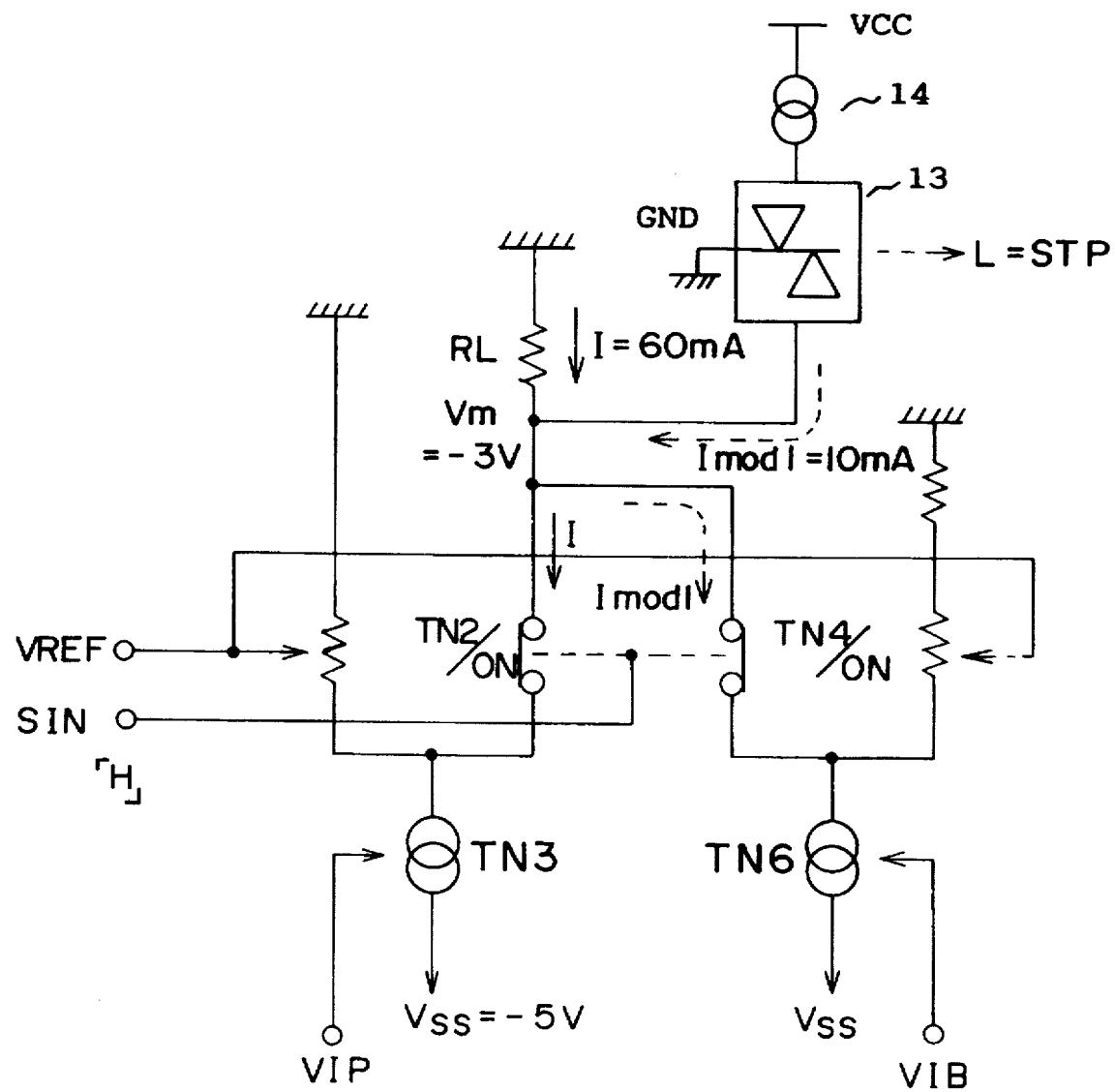
FIG. 11 is an equivalent circuit diagram for explaining the operation (when SIN="H" level) of the drive circuit shown in FIG. 10.

Next, the operation of the laser driver according to the first embodiment will be described with reference to FIG. 11 to FIG. 14. In FIG. 11, first, the power supply line VSS is set to approximately −5 V, the bias voltage VIP of the transistor TN3 and the bias voltage VIB of the transistor TN6 are regulated so that the drive voltage Vm becomes −3 V, and the reference voltage VREF is set. In the embodiment of the present invention, the current I passing in the resistances RL and R0 is set to 60 mA.

First, when the modulation signal SIN shows an "H" level in a state that a laser light emitting element 22 is oscillating, the transistor TN2 is turned ON and the current I=60 mA passes in the resistance RL as shown in FIG. 11. At this time, the drive voltage Vm=−3 V is generated across the load element RL. This is supplied to the optical modulator 23 as the reverse bias. Further, the current Imod1 of approximately 10 mA passes out of the optical modulator 23 to the laser driver. A current I=60 mA passing in the resistance RL passes into transistor TN3 through the transistor TN2, and the current Imod1 from the optical modulator 23 passes into the transistor TN4. With this, the laser light emitted from the inside of the laser light emitting element 22 is absorbed by the electric field in the optical modulator 23, and the output light to outside is intercepted.

Figure 12:
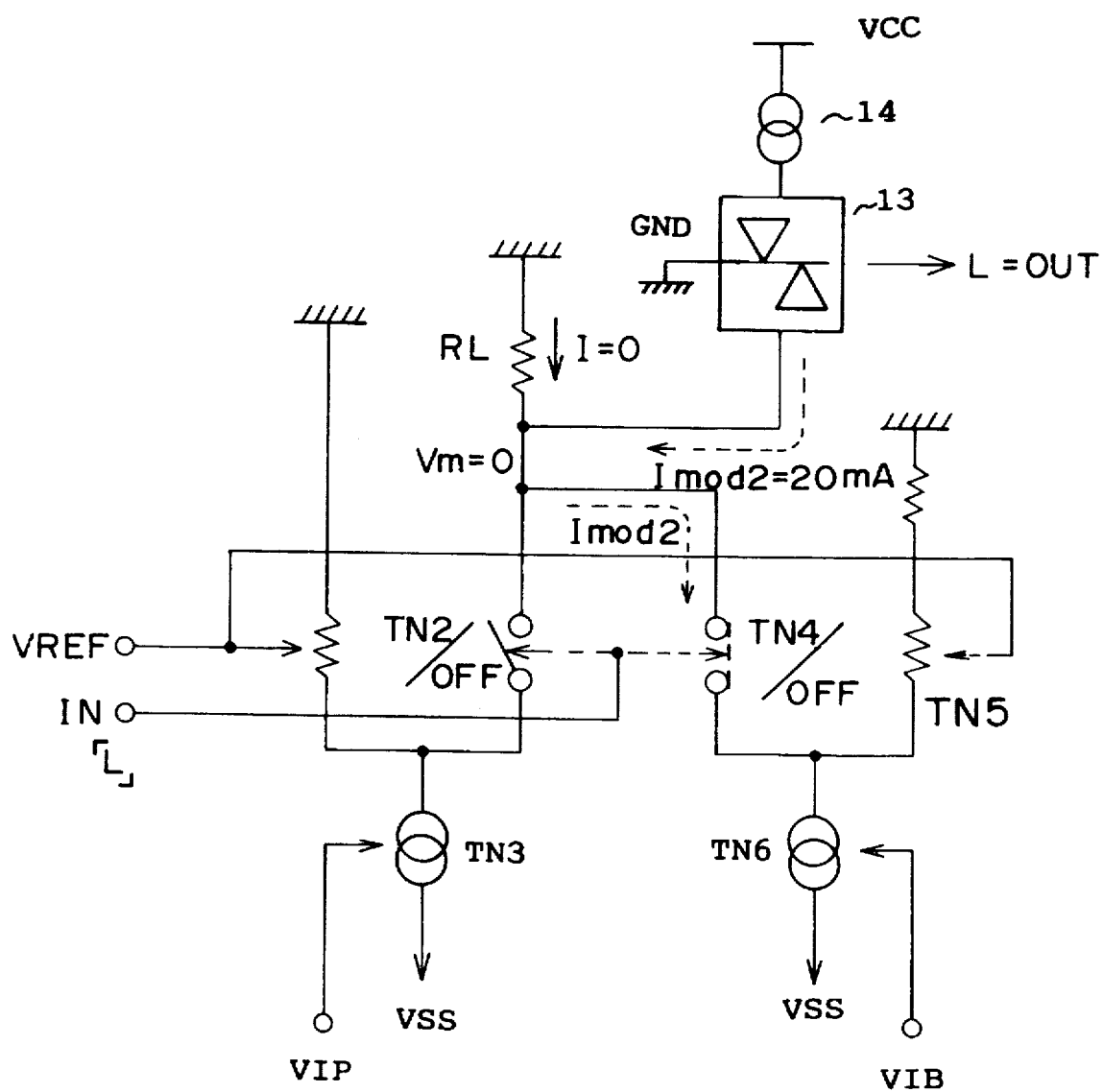
FIG. 12 is an equivalent circuit diagram for explaining the operation (when SIN="L" level) of the drive circuit shown in FIG. 10.

On the contrary, as shown in FIG. 12, when the modulation signal SIN shows an "L" level, the transistor TN2 is turned OFF, the transistor TN4 is turned OFF incompletely, and the current I does not pass in the resistance RL. At this time, the drive voltage Vm becomes almost 0 V. Further, the current Imod2 (approximately 20 mA) passes out of the optical modulator 23 to the laser driver, but this current Imod2 is drawn in even when modulation signal SIN is an "L" level due to a fact that the size of the transistor TN4 is made larger as compared with the size of the transistor TN5. Since no reverse bias current is supplied to the optical modulator 23 at this time, the laser light emitted from the laser light emitting element 22 passes through without being absorbed by the electric field in the optical modulator 23, and is outputted outside.

Figure 13:
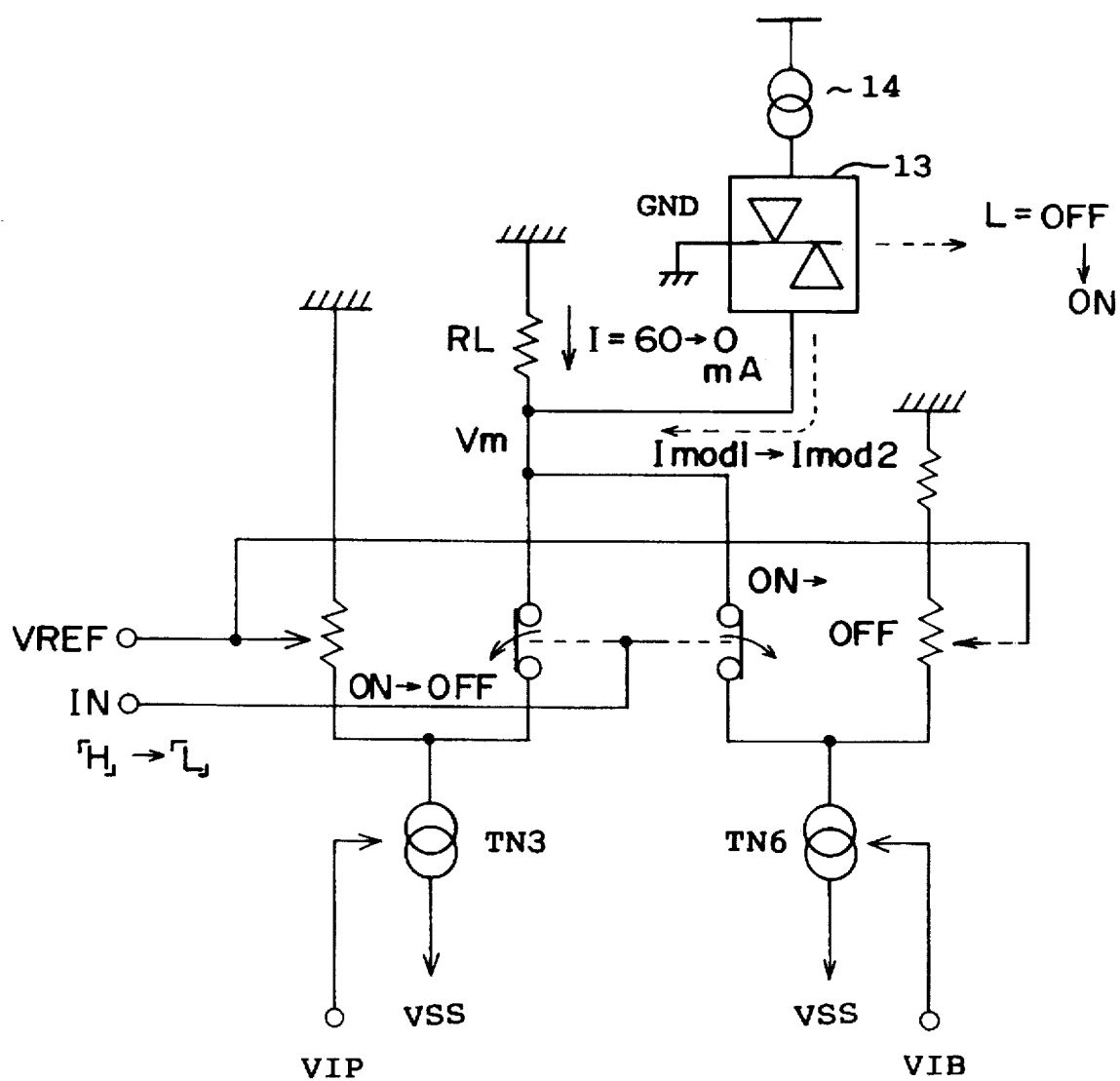
FIG. 13 is an equivalent circuit diagram for explaining the operation (when SIN="H"→"L" level) of the drive circuit shown in FIG. 10.

Further, as shown in FIG. 13, when the modulation signal SIN transits from an "H" level to an "L" level, the transistor TN2 is turned OFF from ON, and the current I passing in the resistance RL changes from 60 mA to almost 0 mA. At this time, the drive voltage Vm across the load element RL changes from −3 V to 0 V. Further, the current of the optical modulator 23 changes from Imod1 to Imod2. The change portion from Imod1 to Imod2 is drawn by the transistor TN4, and the laser output undergoes the transition from OFF to ON.

Figure 14:
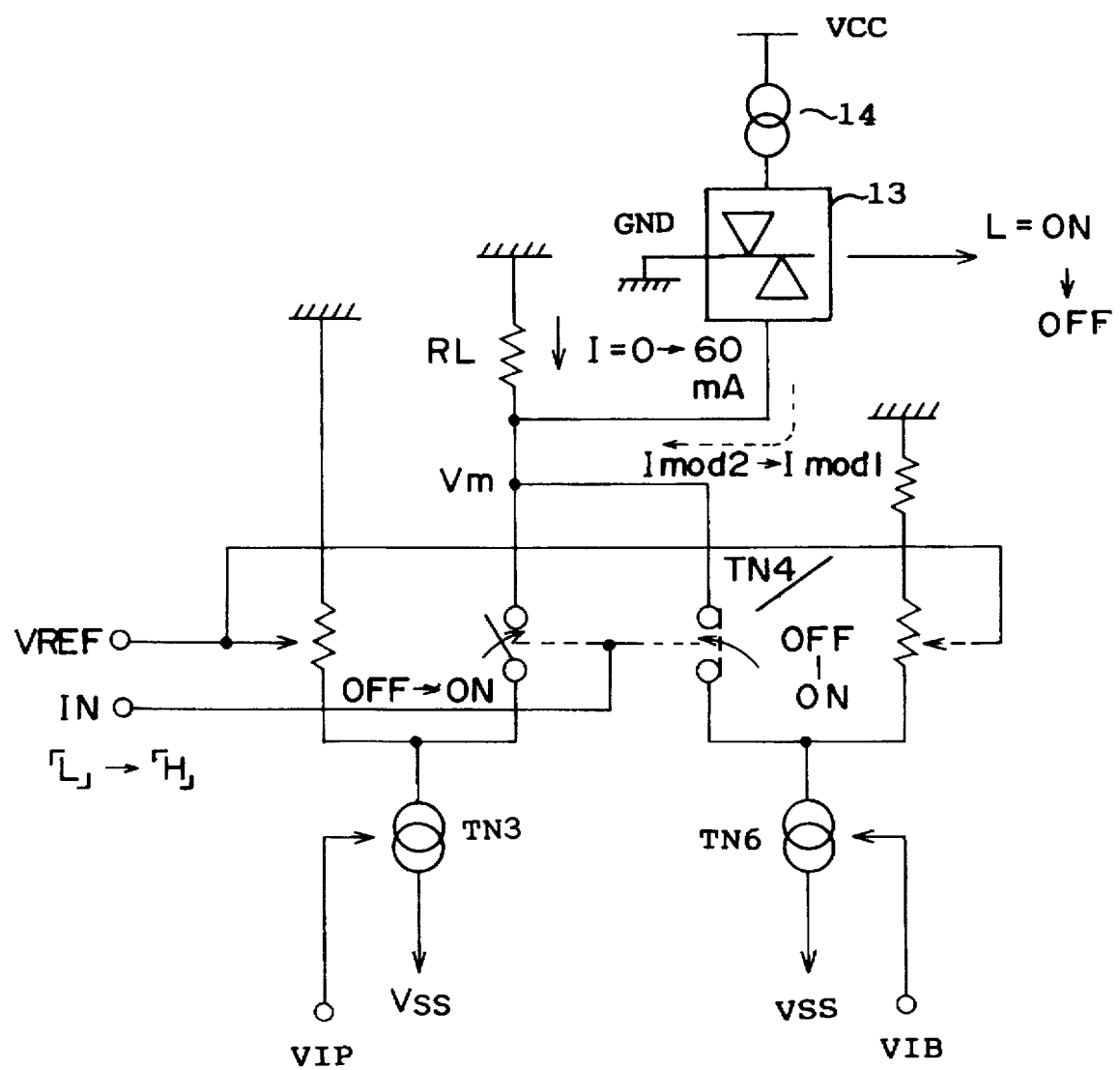
FIG. 14 is an equivalent circuit diagram for explaining the operation (when SIN="L"→"H" level) of the drive circuit shown in FIG. 10.

Furthermore, as shown in FIG. 14, when the modulation signal SIN transits from the "L" level to the "H" level, the transistor TN2 is turned ON from OFF, and the current I passing through the resistance RL changes from 0 mA to approximately 60 mA. At this time, the drive voltage Vm across the load element RL changes from 0 V to −3 V. Further, the current of the optical modulator 23 changes from Imod2 to Imod1. The change portion from Imod2 to Imod1 is drawn by the transistor TN4, and the laser output undergoes the transition from ON to OFF.

In such a manner, the current passing out of the optical modulator 23 to the laser driver is Imod1 when the modulation signal SIN is at an "H" level and Imod2 when the modulation signal SIN is at an "L" level as described with reference to FIG. 11 to FIG. 14, but it is regulated so that the drive voltage Vm becomes constant by means of the fourth transistor TN4 even though Imod1 and Imod are different from each other according to the laser driver described above.

This is because of following reasons. Since the transistor TN2 is turned OFF when the modulation signal SIN is at an "L" level as shown in FIG. 12, the current I scarcely passes in the resistance RL. Although the transistor TN4 is turned OFF simultaneously with the above, the transistor TN4 is not turned OFF completely since the size of the transistor TN4 is made larger than the size of the transistor TN5, but the off-resistance thereof increases as compared with the on-resistance. The off-resistance of the transistor TN4 shows a value in a degree of applying the current Imod2 (approximately 20 mA) from the optical modulator 23. With this, the transistor TN4 draws the current Imod2 equal to a current that is more than the transistor TN5 can pass to the transistor TN6. Since the potential at the output point of differential amplifier 11 when the modulation signal SIN is at an "L" level is determined virtually by a split ratio of resistance obtained by combining an internal resistance (in a forward direction) of the laser light emitting element 22 and the resistance of the transistor TN4 with each other, the drive voltage (drive signal) becomes almost 0 V.

Besides, the potential of the output point of the differential amplifier 11 when the modulation signal SIN is at an "H" level is determined virtually by RLxl, i.e., the ratio of the load resistance RL to the on-resistance of the transistor TN2. Further, the current Imod1 (approximately 10 mA) from the optical modulator 23 passes to the transistor TN6 by the on-operation of the transistor TN4.

Since the resistance of the bypass channel of current passing out of the optical modulator 23 by the drive signal of differential amplifier 11 is regulated so that the drive voltage Vm becomes constant by means of the transistor TN4 of the differential amplifier 12 based on the modulation signal SIN, the fluctuation of the drive voltage Vm is controlled, and the modulation operation of the optical modulator 23 is stabilized.

With this, a drive circuit optimum for an MI-DFB laser diode in which transmission characteristics of 100 Km or longer and 2.5 Gb/s are expected is provided, which contributes the improvement of an optical communication system of long-distance transmission and large capacity.

The second embodiment

Figure 15:
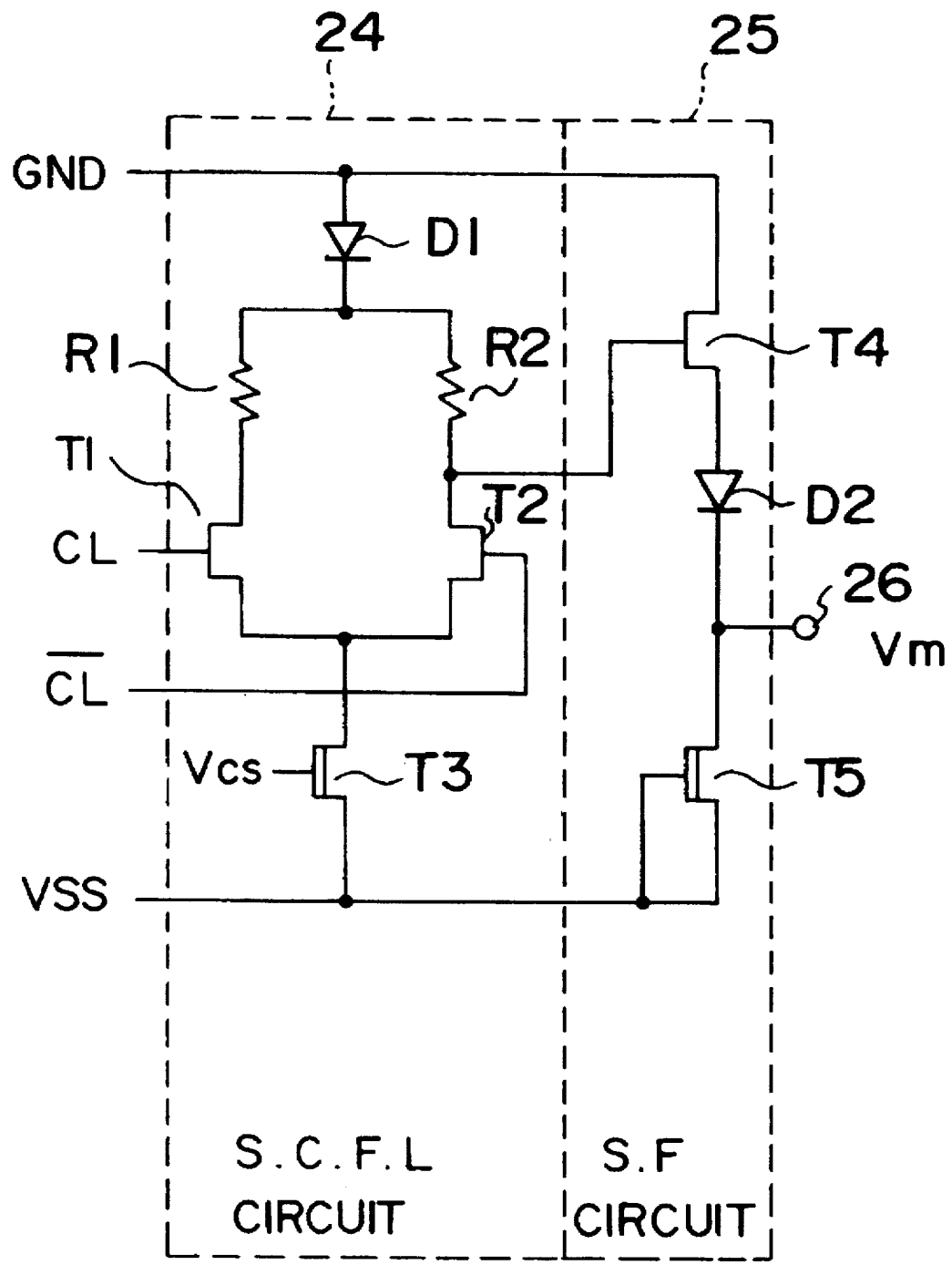
FIG. 15 is a block diagram of a drive circuit of a modulator-integrate distributed-feedback laser diode according to a second preferred embodiment of the present invention.

A second preferred laser driver is obtained by devising the output circuit of the first laser driver. The second laser driver is provided with a differential amplifier 24 and a source follower circuit 25 as shown in FIG. 15.

Figure 16:
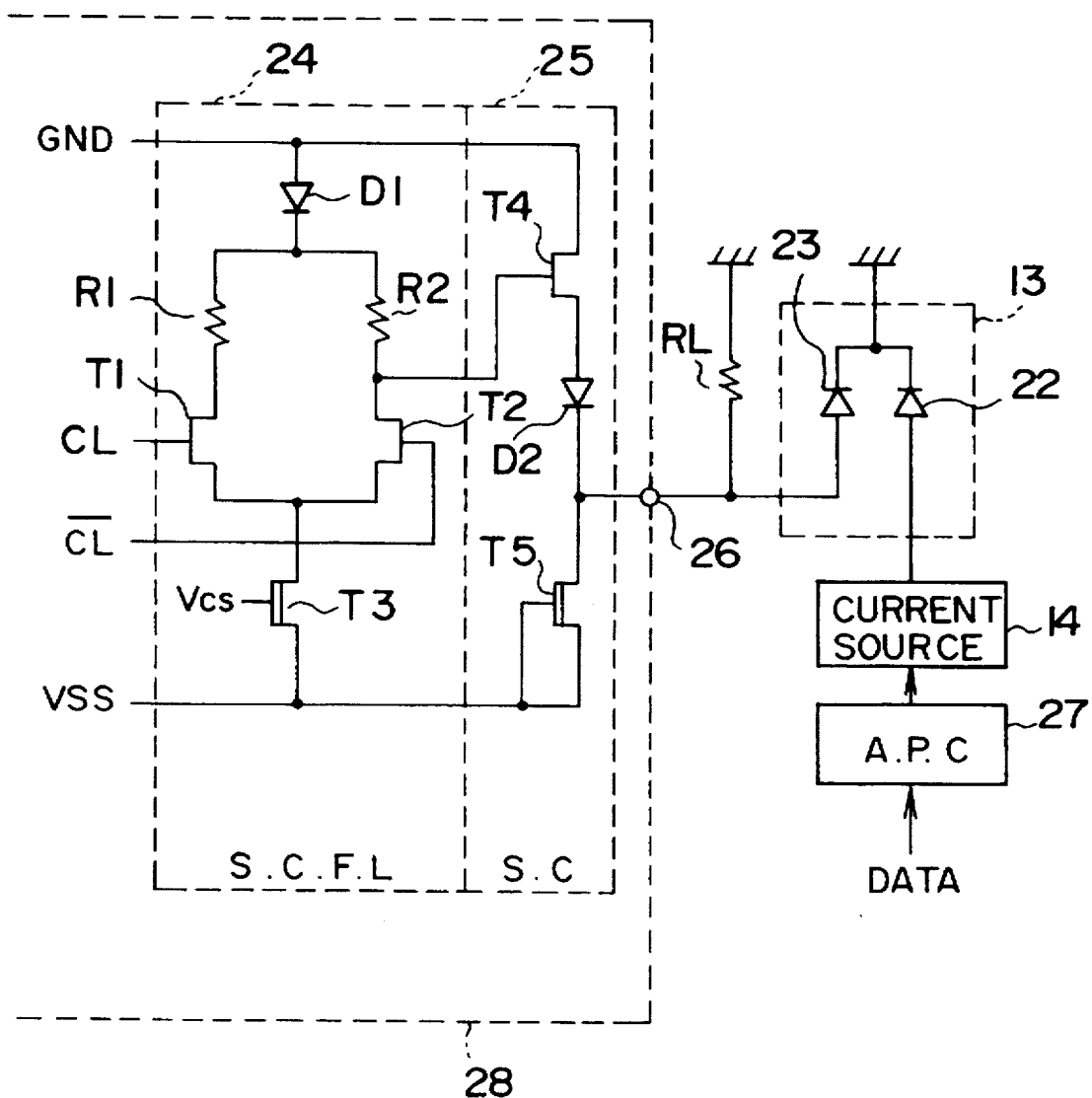
FIG. 16 is a circuit diagram in which an IC with the drive circuit shown in FIG. 15 integrated and a modulator-integrate distributed-feedback laser diode are connected to each other.

The differential amplifier which is a source coupled field effect transistor logic circuit (hereinafter referred to as an SCFL circuit) 24 outputs a difference signal to the source follower circuit 25 in accordance with a first control signal CL for optical modulation of such an MI-DFB laser diode 13 as shown in FIG. 16 and a second control signal $\overline{CL}$ obtained by inverting this control signal CL.

The SCFL circuit 24 includes a level shifter D1 connected to the power supply line GND at one end thereof, load resistances R1 and R2 connected to another end of the level shifter D1 at one end of each resistance, a transistor T1 with the drain thereof connected to another end of the load resistance R1, a transistor T2 with the drain thereof connected to another end of the load resistance R2, and a transistor T3 with the drain thereof connected to respective sources of the transistors T1 and T2 and with the source thereof connected to the power supply line VSS, respectively.

The transistors T1 and T2 are formed of enhancement type GaAs metal semiconductor (MES) transistors, and the transistor T3 is formed of a depletion type GaAs MES transistor, respectively. The transistor T3 forms a constant current source, and the level shifter D1 is formed of a Schottky diode. The power supply line GND supplies voltage of 0 V, and the power supply line VSS supplies −5.2 V for instance.

The control signal CL is supplied to the gate of the transistor T1, the control signal $\overline{CL}$ is supplied to the gate of the transistor T2, and bias voltage Vcs for determining a working current of the circuit is supplied to the gate of the transistor T3, respectively.

The source follower circuit 25 generates the drive voltage Vm in accordance with the difference signal from the SCFL circuit 24, and outputs the drive voltage Vm to the MI-DFB laser diode 13. The drive voltage Vm is outputted from an output terminal 26.

The source follower circuit 25 includes a transistor T4 with the drain thereof connected to the power supply line GND and with the gate thereof connected to the drain of the transistor T2, respectively, a level shifter D2 connected to the source of the transistor T4 at one end, and a transistor T5 with the drain thereof connected to another end of the level shifter D2 and one end of the MI-DFB laser diode 13 and with the gate and source thereof connected to the power supply line VSS, respectively.

The transistor T4 is formed of an enhancement type GaAs MES transistor, and the transistor T5 is formed of a depletion type GaAs MES transistor, respectively. The transistor T5 forms a constant current source, and the level shifter D2 is formed of a Schottky diode.

A load resistance RL, an MI-DFB laser diode 13, a DC current source 14 and an auto-power-control (APC) circuit 27 such as shown in FIG. 16 are connected to an IC 28 in which the second laser driver is integrated on a compound semiconductor substrate so as to drive the laser diode 13 with modulation. In FIG. 16, the DC current source 14 supplies a DC current to a laser light emitting element 22 of the laser diode 13.

The APC circuit 27 controls the output of the DC current source 14 based on the data showing abnormality of optical output or the like.

Next, the operation of the second laser driver will be described with reference to FIG. 16. When the signal CL is at an "H" level and the control signal $\overline{CL}$ is at an "L" level, the transistor T1 is turned ON, the transistor T2 is turned OFF, and the drain of the transistor T2 shows an "H" level.

In this case, since a current passes in the transistor T5 principally from the power supply line GND through the transistor T4 and the diode D2, the drive voltage Vm close to 0 V obtained by subtracting drain to source voltage $V_{Dc}$ of the transistor T4 and forward voltage $V_F$ of the level shifter D2 from 0 V is obtainable as the voltage at an "H" level from the output terminal 26.

As against the above, when the control signal CL is at an "L" level and the control signal $\overline{CL}$ is at an "H" level, the transistor T1 is turned OFF, the transistor T2 is turned ON, and the drain of the transistor T2 shows an "L" level.

In this case, a current passes in the transistor T5 principally from the load resistance RL and the optical modulator 23, thereby to determine the voltage at an "L" level at the output terminal 26. In the present embodiment, the drive voltage Vm of approximately −3 V is obtained from the output terminal 26 as voltage at an "L" level.

According to a laser driver related to the second preferred embodiment of the present invention, the voltage close to 0 V as the voltage at an "H" level and about −3 V as the voltage at an "L" level are thus obtainable from the output terminal 26. Accordingly, it is possible to sufficiently drive the optical modulator 23 of the MI-DFB laser diode 13 and to control the optical output with high precision.

Besides, it is possible to bring the voltage at an "H" level obtainable from the output terminal 26 closer to 0 V by varying the value of the load resistance R2, or by replacing the resistance R2 with a depletion type GaAs MES transistor, or by eliminating the Schottky diode D2.

Further, when the resistance R2 is replaced with a GaAs MES transistor and gate voltage is applied to this transistor from the outside, the ON resistance value of the transistor is regulated variably, thus making it possible to control the voltage at an "H" level obtainable through the output terminal 26 from the outside.

The third embodiment

Figure 17:
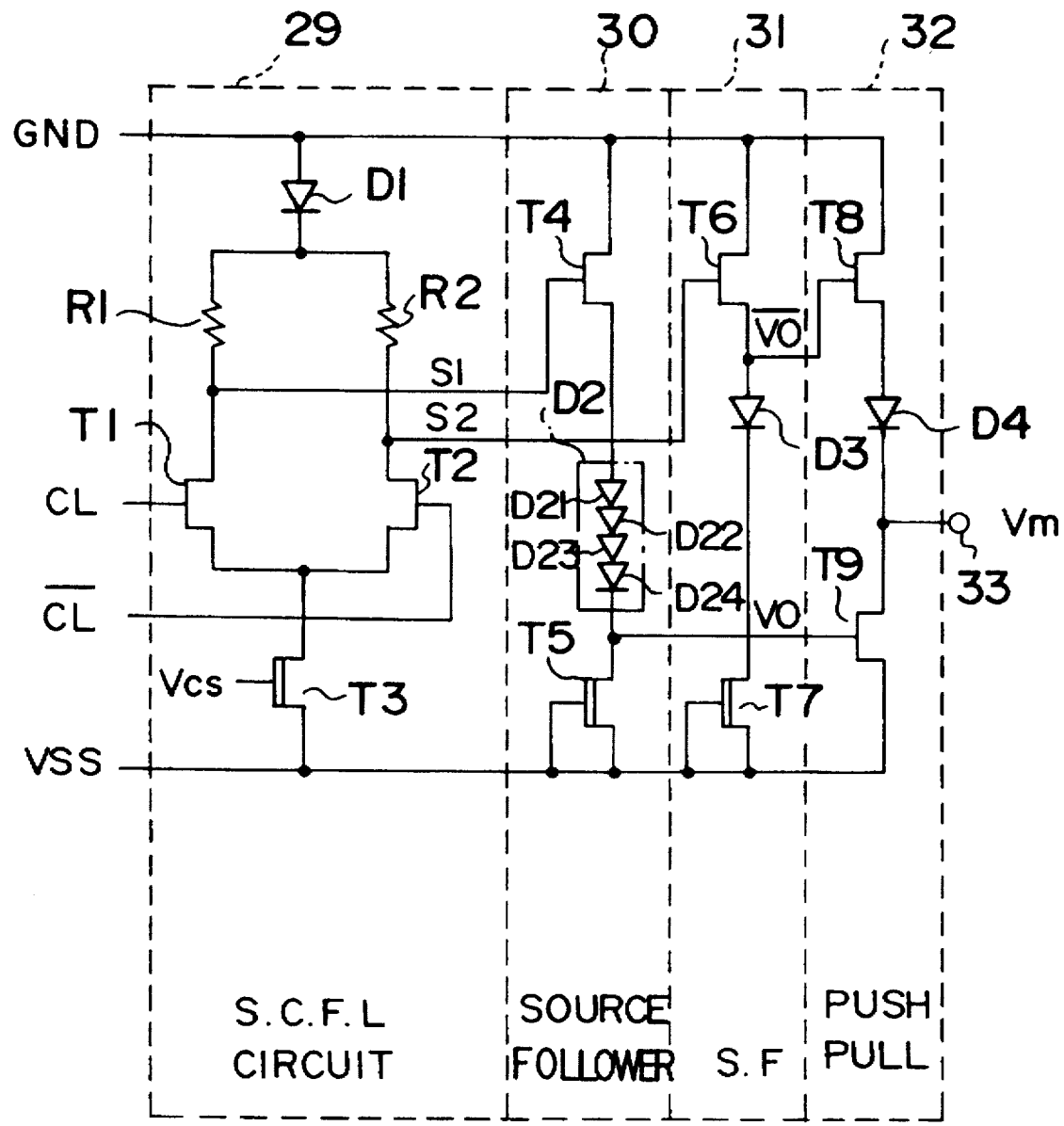
FIG. 17 is a block diagram of a drive circuit of a modulator-integrate distributed-feedback laser diode according to a third preferred embodiment of the present invention.

A third preferred laser driver is obtained by devising the output circuit of the first laser driver. As shown in FIG. 17, the third laser driver is provided with a differential amplifier 29, a first and a second source follower circuits 30 and 31, and a push-pull circuit 32.

Figure 18:
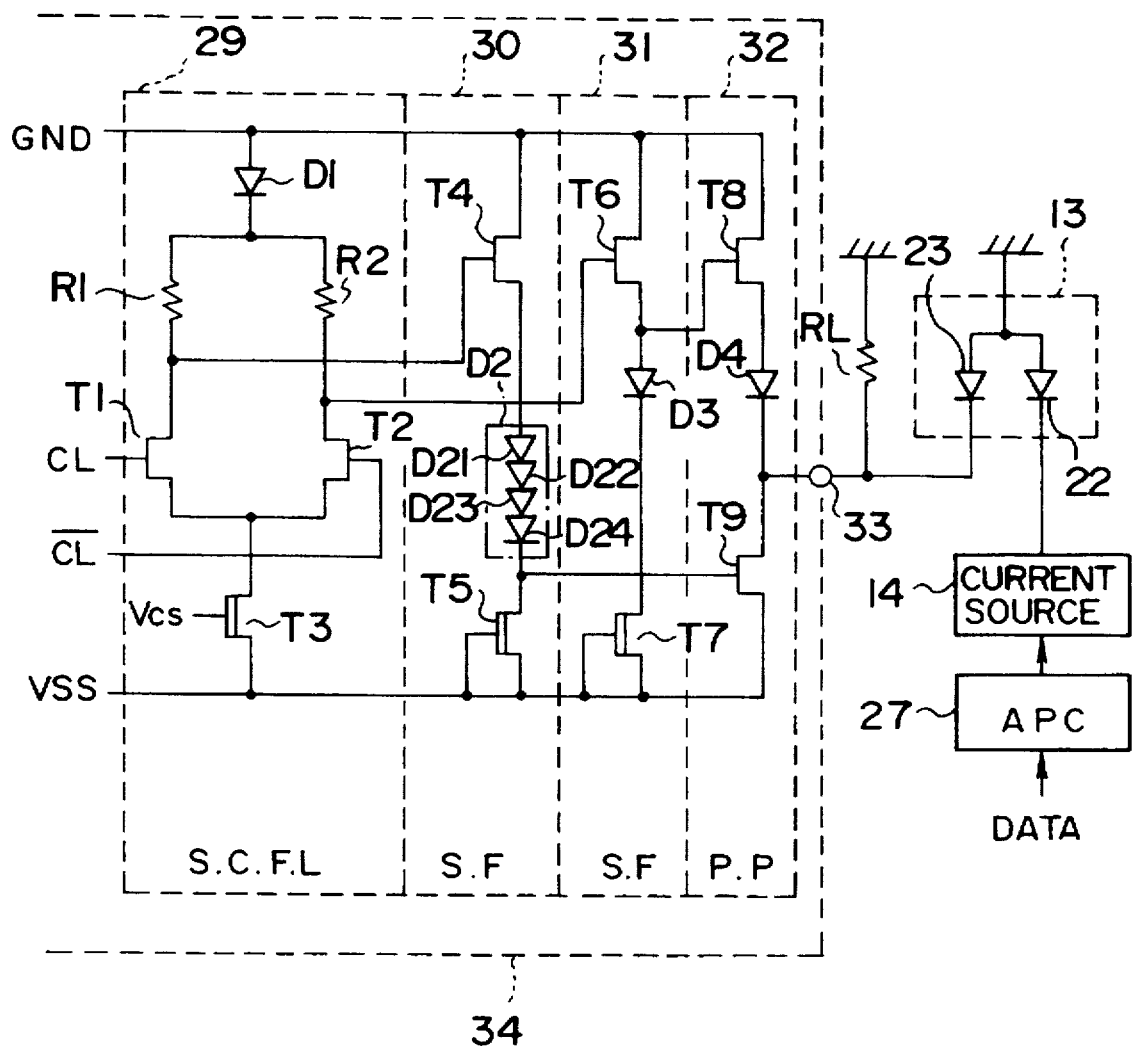
FIG. 18 is a circuit diagram in which an IC with the drive circuit shown in FIG. 17 integrated and a modulator-integrate distributed-feedback laser diode are connected to each other.

The differential amplifier (hereinafter referred to as an SCFL circuit) 29 outputs a first difference signal S1 to the source follower circuit 30 in accordance with a first control signal CL for optical modulation of such an MI-DFB laser diode 13 as shown in FIG. 18 and a second control signal $\overline{CL}$ obtained by inverting the control signal CL, and outputs a second difference signal S2 to the source follower circuit 31, respectively. Since the SCFL circuit 29 has the same structure as that of the SCFL circuit 24 of the second laser driver, the description thereof is omitted.

The source follower circuit 30 outputs a non-inverted output signal V0 to the push-pull circuit 32 in accordance with the first difference signal S1 from the SCFL circuit 29. The source follower circuit 30 includes a transistor T4 with the drain thereof connected to the power supply line GND and with the gate thereof connected to the drain of the transistor T1, respectively, a level shifter D2 connected to the source of the transistor T4 at one end, and a transistor T5 with the drain thereof connected to another end of the level shifter D2 and with the gate and source thereof connected to the power supply line VSS. The level shifter D2 is formed of cascade-connected Schottky diodes D21 to D24.

The source follower circuit 31 outputs an inverted output signal $\overline{V0}$ to the push-pull circuit 32 in accordance with a second difference signal S2 from the SCFL circuit 29. The source follower circuit 31 includes a transistor T6 with the drain thereof connected to the power supply line GND and with the gate thereof connected to the drain of the transistor T2, respectively, a level shifter D3 connected to the source of the transistor T6 at one end, and a transistor T7 with the drain thereof connected to another end of the level shifter D3 and with the gate and source thereof connected to the power supply line VSS.

The push-pull circuit 32 generates drive voltage Vm in accordance with the non-inverted output signal V0 from the source follower circuit 30 and the inverted output signal $\overline{V0}$ from the source follower circuit 31, and outputs the drive voltage Vm to the MI-DFB laser diode 13. The drive voltage Vm is obtainable from an output terminal 33.

The push-pull circuit 32 includes a transistor T8 with the drain thereof connected to the power supply line GND and with the gate thereof connected to the source of the transistor T6, respectively, a level shifter D4 connected to the source of the transistor T8 at one end, and a transistor T9 with the drain thereof connected to another end of the level shifter D4 and one end of the MI-DFB laser diode 13 and with the gate thereof connected to the drain of the transistor T5, respectively.

Further, the transistors T4, T6, T8 and T9 are formed of enhancement type GaAs MES transistors, and the transistors T5 and T7 are formed of depletion type GaAs MES transistors, respectively.

The transistors T5 and T7 form constant current sources, the transistor T8 forms a pull-up element in which ON/OFF is controlled by the source voltage of the transistor T6, and the transistor T9 forms a pull-down element in which ON/OFF is controlled by the cathode voltage of the diode D5. Respective level shifters D1 to D4 are formed of Schottky diodes. The power supply line GND supplies voltage of 0 V, and the power supply line VSS supplies −5.2 V for instance.

A load resistance RL, an MI-DFB laser diode 13, a DC current source 14 and an auto-power-control (APC) circuit 27 such as shown in FIG. 18 are connected to an IC 34 in which such a third laser driver is integrated on a compound semiconductor substrate, thereby to drive the laser diode 13 with modulation. In FIG. 18, description of functions of the DC current source 14 and the APC circuit 27 is omitted since it has been made previously.

Next, the operation of the third laser driver will be described with reference to FIG. 18. When the control signal CL is at an "H" level and the control signal $\overline{CL}$ is at an "L" level, the transistor T1 is turned ON, the transistor T2 is turned OFF, the drain of the transistor T1 shows an "L" level, and the drain of the transistor T2 shows an "H" level.

As a result, the cathode of a diode D24 of the level shifter D2 shows an "L" level and the source of the transistor T6 shows an "H" level, and the transistor T8 is turned ON and the transistor T9 is turned OFF. Accordingly, when a leakage current of the transistor T9 is taken into consideration in this case, 0 V is unobtainable as the drive voltage Vm at an "H" level at the output terminal 33, but approximately 0 V is obtainable there.

As against the above, when the control signal CL is at an "L" level and the control signal $\overline{CL}$ is at an "H" level, the transistor T1 is turned OFF, the transistor T2 is turned ON, the drain of the transistor T1 shows an "H" level, and the drain of the transistor T2 shows an "L" level.

As a result, the cathode of the diode D24 shows an "H" level, the source of the transistor T6 shows an "L" level, the transistor T8 is turned OFF, and the transistor T9 is turned ON. In this case, −3 V for instance is obtainable as the drive voltage Vm at an "L" level at the output terminal 33.

In this manner, according to a laser driver related to the third embodiment of the present invention, approximately 0 V as the drive voltage Vm at an "H" level and −3 V as the voltage at an "L" level are obtainable at the output terminal 33. Therefore, it is possible to drive the optical modulator 23 of the MI-DFB laser diode 13 more sufficiently than the second embodiment, and to control the optical output with high precision.

Besides, when the resistance R2 is replaced with a GaAs MES transistor and the gate voltage is applied to this transistor from the outside, it is possible to control the level at an "H" level obtainable at the output terminal 33 from the outside.

Figure 19:
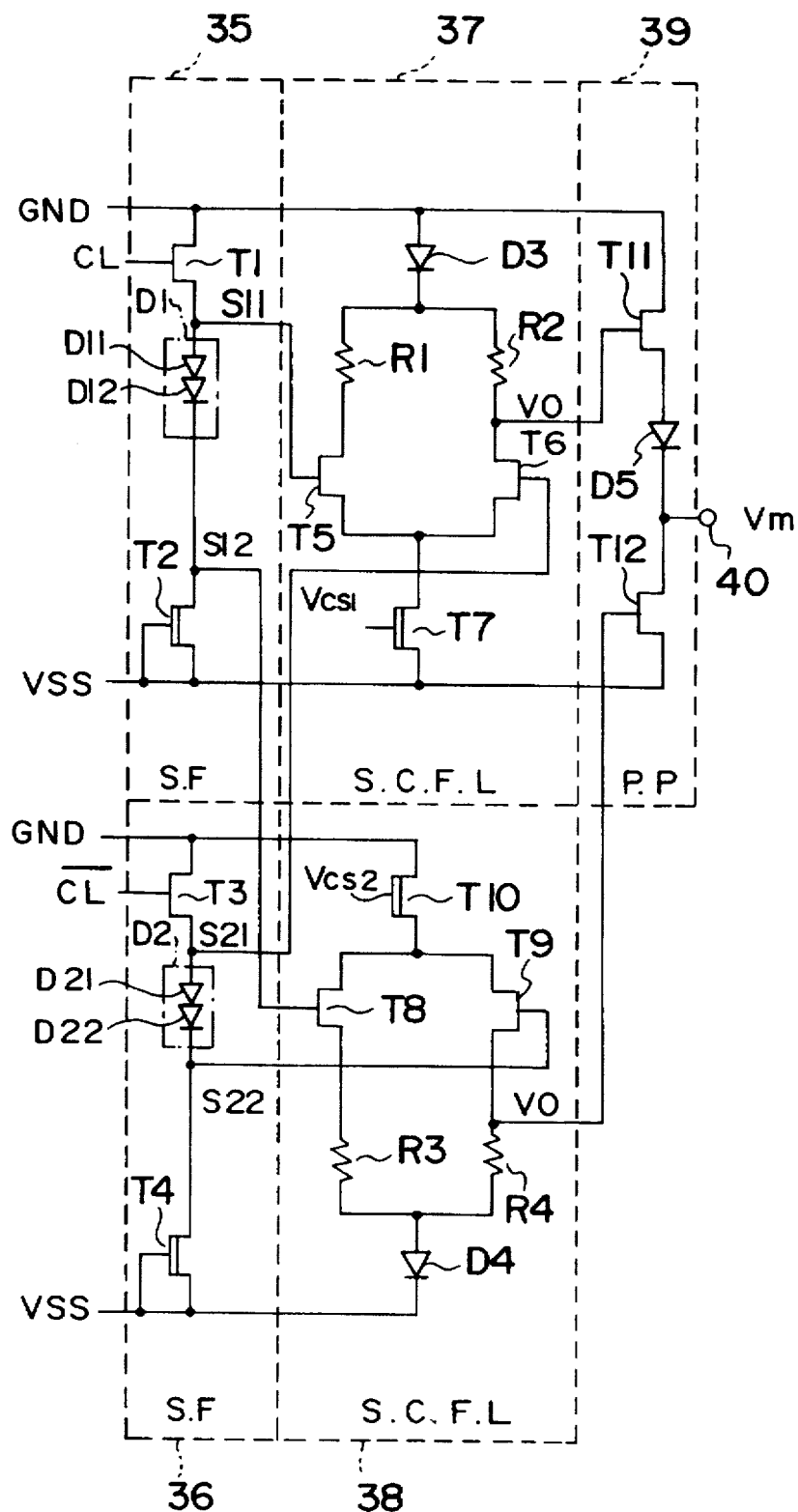
FIG. 19 is a block diagram of a drive circuit of a modulator-integrate distributed-feedback laser diode according to a fourth preferred embodiment of the present invention.

Further, when the Schottky diodes D21 to D24 are replaced with GaAs MES transistors and the gate voltage is applied to these transistors from the outside, the ON resistance values of the transistors are regulated variably, thus making it possible to control the voltage at an "L" level obtainable at the output terminal 33 from the outside. The fourth embodiment A fourth preferred laser driver is obtained by driving the output circuit of the first laser driver. The fourth laser driver is provided with a first and a second source follower circuits 35 and 36, a first and a second differential amplifiers (hereinafter referred to as SCFL circuits) 37 and 38 and a push-pull circuit 39 as shown in FIG. 19.

The source follower circuit 35 generates a non-inverted output signal S11 and an inverted output signal S12 in accordance with a first control signal CL for optical modulation of an MI-DFB laser diode 13. The signal S11 is outputted to an SCFL circuit 37, and the signal S12 is outputted to an SCFL circuit 38, respectively. The source follower circuit 35 includes a transistor T1 with the drain thereof connected to a power supply line GND, a level shifter D1 connected to the source of the transistor T1 at one end thereof, and a transistor T2 with the drain thereof connected to another end of the level shifter D1 and with the gate and source thereof connected to a power supply line VSS.

The transistor T1 is formed of an enhancement type GaAs MES transistor, and the transistor T2 is formed of a depletion type GaAs MES transistor, respectively. The transistor T2 forms a constant current source, and the level shifter D1 is formed of Schottky diodes D11 and D12. The power supply line GND supplies the voltage of 0 V and the power supply line VSS supplies −5.2 V for instance. A control signal CL is supplied to the gate of the transistor T1.

The source follower circuit 36 generates a non-inverted output signal S21 and an inverted output signal S22 in accordance with a second control signal $\overline{CL}$ obtained by inverting the first control signal CL. The signal S21 is outputted to an SCFL circuit 37, and the signal S22 is outputted to an SCFL circuit 38, respectively. The source follower circuit 36 includes a transistor T3 with the drain thereof connected to the power supply line GND, a level shifter D2 connected to the source of the transistor T3 at one end thereof, and a transistor T4 with the drain thereof connected to another end of the level shifter D2 and with the gate and source thereof connected to the power supply line VSS.

The transistor T3 is formed of an enhancement type GaAs MES transistor, and the transistor T4 is formed of a depletion type GaAs MES transistor, respectively. The transistor T4 forms a constant current source, and the level shifter D2 is formed of Schottky diodes D21 and D22.

The SCFL circuit 37 generates V0 in accordance with respective non-inverted output signals S11 and S21 from the source follower circuits 35 and 36, and outputs this voltage V0 to the push-pull circuit 39. The SCFL circuit 37 includes a level shifter D3 connected to the power supply line GND at one end thereof, load resistances R1 and R2 connected to another end of the level shifter D3 at one end of each resistance, a transistor T5 with the drain thereof connected to one end of the load resistance R1 and with the gate thereof connected to the source of the transistor T1, respectively, a transistor T6 with the drain thereof connected to another end of the load resistance R2 and the gate thereof connected to the source of the transistor T3, and a transistor T7 with the drain thereof connected to respective sources of the transistors T5 and T6 and with the source thereof connected to the power supply line VSS.

The transistors T5 and T6 are formed of enhancement type GaAs MES transistors, and the transistor T7 is formed of a depletion type GaAs MES transistor, respectively. The transistor T7 forms a constant current source, and the level shifter D3 is formed of a Schottky diode.

The signal S11 is supplied to the gate of the transistor T5, the signal S21 is supplied to the gate of the transistor T6, and bias voltage $V_{cs1}$ determining a working current of the circuit is supplied to the gate of the transistor T7, respectively.

The SCFL circuit 38 generates $\overline{V0}$ in accordance with respective inverted output signals S12 and S22 from the source follower circuits 35 and 36, and outputs this voltage $\overline{V0}$ to the push-pull circuit 39. The SCFL circuit 38 includes a level shifter D4 connected to the power supply line VSS at one end thereof, load resistances R3 and R4 with one end connected to another end of the level shifter D4, respectively, a transistor T8 with the source thereof connected to another end of the load resistance R3 and with the gate thereof connected to the drain of the transistor T2, respectively, a transistor T9 with the source thereof connected to another end of the load resistance R4 and with the gate thereof connected to the drain of the transistor T4, respectively, and a transistor T10 with the source thereof connected to respective drains of the transistors T8 and T9 and with the drain thereof connected to the power supply line GND.

The transistors T8 and T9 are formed of enhancement type GaAs MES transistors, and the transistor T10 is formed of a depletion type GaAs MES transistor, respectively. The transistor T10 forms a constant current source, and the level shifter D4 is formed of a Schottky diode.

The signal S12 is supplied to the gate of the transistor T8, the signal S22 is supplied to the gate of the transistor T9, and bias voltage $V_{cs2}$ determining the working current of the circuit is supplied to the gate of the transistor T10, respectively.

The push-pull circuit 39 generates drive voltage Vm in accordance with the V0 and $\overline{V0}$ from the SCFL circuits 37 and 38, and outputs the drive voltage Vm to the MI-DFB laser diode 13. The drive voltage Vm is obtainable from an output terminal 40.

The push-pull circuit 39 includes a transistor T11 with the drain thereof connected to the power supply line GND and with the gate thereof connected to the drain of the transistor T6, respectively, a level shifter D5 connected to the source of the transistor T11 at one end thereof, and a transistor T12 with the drain thereof connected to another end of the level shifter D5 and one end of the MI-DFB laser diode 13 and with the gate thereof connected to the source of the transistor T9.

The transistors T11 and T12 are formed of enhancement type GaAs MES transistors, and transistor T11 forms a pull-up element in which ON/OFF is controlled by the drain voltage of the transistor T6 and the transistor T12 forms a pull-down element in which ON/OFF is controlled by the drain voltage of the transistor T9. The level shifter D5 is formed of a Schottky diode. Voltage V0 is supplied to the gate of the transistor T11, and the voltage $\overline{V0}$ is supplied to the gate of the transistor T12.

Figure 20:
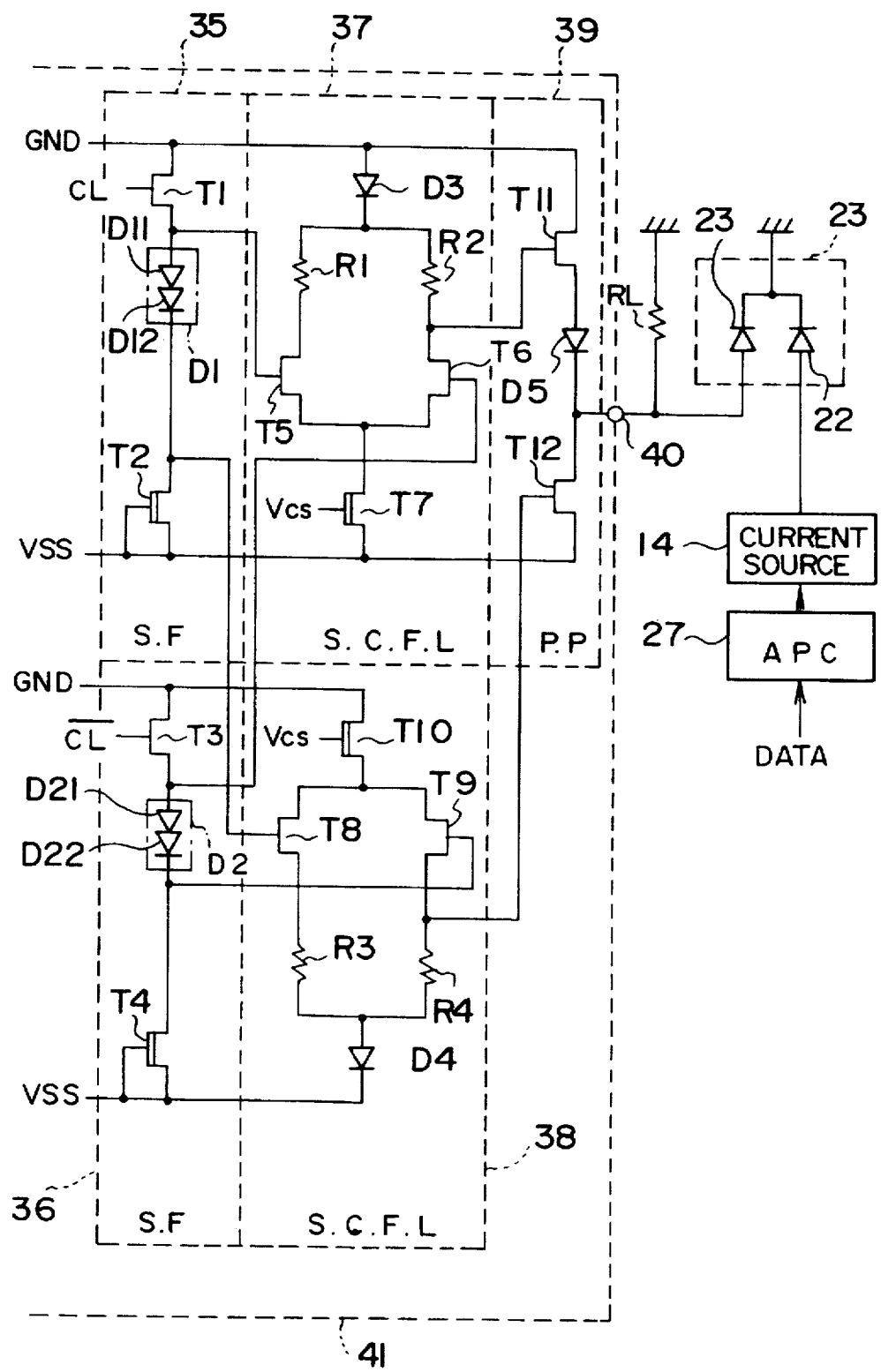
FIG. 20 is a circuit diagram in which an IC with the drive circuit shown in FIG. 19 integrated and a modulator-integrate distributed-feedback laser diode are connected to each other.

A load resistance RL, an MI-DFB laser diode 23, a DC current source 14 and an auto-power-control (APC) circuit 27 such as shown in FIG. 20 are connected to an IC 41 in which such fourth laser driver is integrated on a compound semiconductor substrate, thereby to drive the laser diode 23 with modulation. In FIG. 20, since the functions of the DC current source 14 and the APC circuit 27 have been described previously, the description thereof is omitted.

Next, the operation of the fourth laser driver will be described with reference to FIG. 20. When a control signal CL is at an "H" level and a control signal $\overline{CL}$ is at an "L" level, the transistor T1 is turned ON, the transistor T2 is turned OFF, the source of the transistor T1 shows an "H" level, and the source of the transistor T3 shows an "L" level.

As a result, the transistor T5 is turned ON, the transistor T6 is turned OFF, the drain of the transistor T6 shows an "H" level, and the transistor T11 is turned ON.

Further, the transistor T8 is turned ON, the transistor T9 is turned OFF, the source of the transistor T9 shows an "L" level, and the transistor T11 is turned OFF.

In this case, since it is possible to make the gate voltage of the transistor T12 lower than the gate voltage of the transistor T9 shown in the third embodiment, it is possible to cut off the transistor T12 completely.

Thus, it is possible to obtain 0V as the voltage at an "H" level at the output terminal 40.

As against the above, when the control signal CL is at an "L" level and the control signal $\overline{CL}$ is at an "H" level, the transistor T1 is turned OFF, the transistor T3 is turned ON, the source of the transistor T1 shows an "L" level and the source of the transistor T3 shows an "H" level.

As a result, the transistor T5 is turned OFF, the transistor T6 is turned ON, the drain of the transistor T6 shows an "L" level, and the transistor T11 is turned OFF.

Further, the transistor T8 is turned OFF, the transistor T9 is turned ON, the source of the transistor T9 shows an "H" level, and the transistor T11 is turned ON.

In this case, since it is possible to make the gate voltage of the transistor T12 higher than the gate voltage of the transistor T9 shown in the third embodiment, it is possible to make the ON-state of the transistor T12 deeper than that of the transistor T9 shown in the third embodiment.

Accordingly, it is possible to obtain the voltage lower than −3 V as the voltage at an "L" level at the output terminal 40 in this case.

Thus, according to a laser driver related to the fourth embodiment of the present invention, it is possible to obtain 0 V as the voltage at an "H" level and the voltage lower than −3 V as the voltage at an "L" level at the output terminal 40. Therefore, it is possible to drive the optical modulator 23 of the MI-DFB laser diode 13 more sufficiently than the laser driver of the third embodiment and to control the optical output with high precision.

Besides, when the Schottky diode D4 is eliminated, lower voltage is obtainable at the output terminal 40 as the voltage at an "L" level.

Further, when the load resistance R2 of the SCFL circuit 37 is replaced with a GaAs MES transistor and the gate voltage is applied to this transistor from the outside, the ON resistance value of the transistor is regulated variably, thus making it possible to control the voltage at an "H" level obtainable at the output terminal 40 from the outside.

Figure 21:
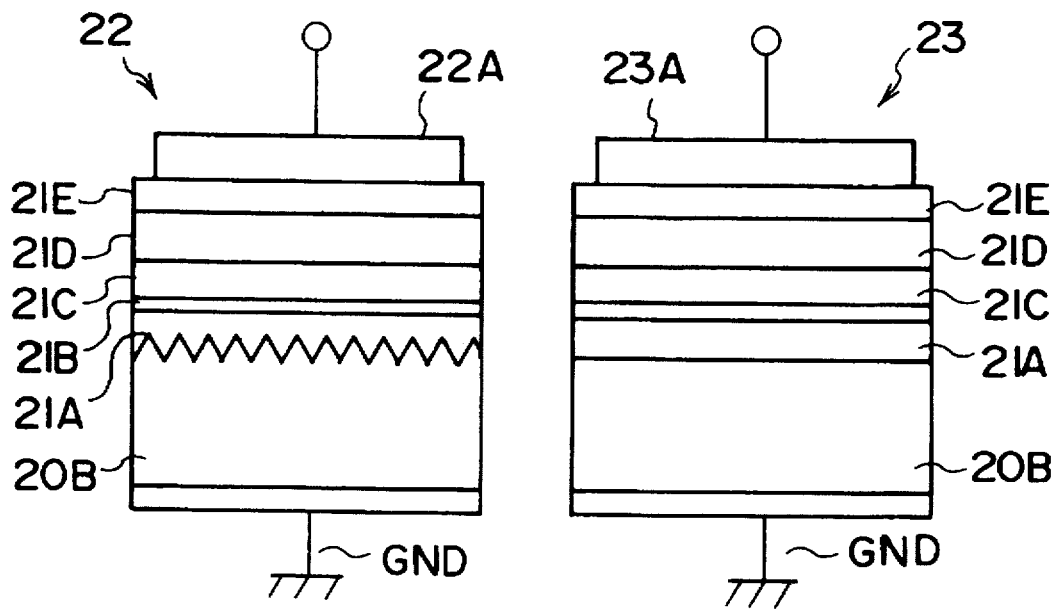
FIG. 21 is sectional view showing a laser diode and an optical modulator when a modulator-integrate distributed-feedback laser diode according to fifth preferred embodiment of present invention is constituted.
Figure 22:
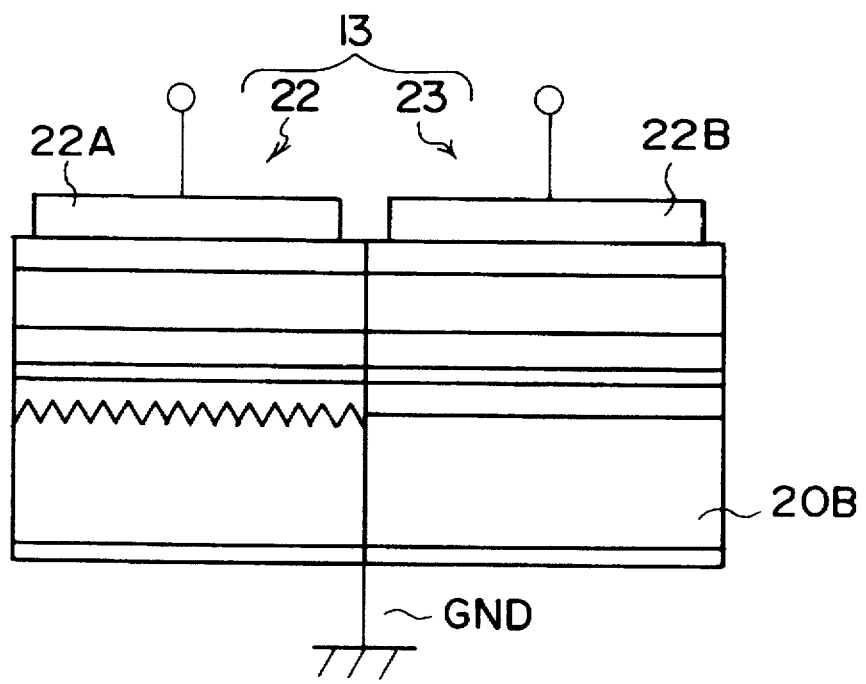
FIG. 22 is sectional view showing a modulator-integrate distributed-feedback laser diode obtained by integrating the laser diode and the optical modulator shown in FIG. 21.

Similarly, when the load resistance R4 of the SCFL circuit 38 is replaced with a GaAs MES transistor and the gate voltage is applied to this transistor from the outside, the ON resistance value of the transistor is regulated variably, thus making it possible to control the voltage at an "L" level obtainable at the output terminal 40 from the outside. The fifth embodiment In the above embodiments of the present invention, a MI-DFB modulator-integrate distributed-feedback laser diode, in which the laser light emitting element 22 and the optical modulator 23 are integrated together on a common substrate, is disclosed. However, in order to modulate the laser light with the laser driver according to the embodiments of the present invention, as shown in FIG.21, the laser light emitting element 22, having the laser electrode (p-electrode) 22A and a ground electrode (n-electrode), and the optical modulator 23, having the optical modulating electrode (p-electrode) 23A and the ground electrode (n-electrode), may be formed separately. And then, as shown in FIG. 22, the laser light emitting element 22 and the optical modulator 23 may be optically combined through the common n-InP substrate 21. In this case, both ground electrodes (n-electrodes) are connected together. Further, either one of the p-electrode and the n-electrode of the laser light emitting element 22 should be electrically connected in common with the electrode having the same conductivity as that of the electrode of the element 22.

In the above MI-DFB modulator-integrate distributed-feedback laser diode, the resistor on the bypass of the current, which flows through the optical modulator 23, is automatically regulated by the compensation circuit of the laser driver according to the modulation signal. As a result, the voltage level of the drive signal of the modulator 23 is compensated at a constant level. Thus, the "H" and "L" levels of the drive voltage for the optical modulator 23 are optimized to stabilize the output light from the MI-DFB laser light emitting element 22.

What is claimed is:

1. A circuit for driving a semiconductor optical modulator which has a first semiconductor layer having a first conduction type, a second semiconductor layer having a second conduction type, and a modulation active layer sandwiched with said first and second semiconductor layers, wherein said semiconductor optical modulator modulates light emission from a semiconductor laser diode having at least a third semiconductor layer having the first conduction type, the third semiconductor layer being electrically connected to the first semiconductor layer of said semiconductor optical modulator, the driving circuit comprising:

an output circuit for outputting a drive signal to said semiconductor optical modulator based on a signal for optical modulation inputted from the outside; and a compensation circuit for regulating a resistance of a bypass channel for the current passing through said semiconductor optical modulator caused by the drive signal of said output circuit based on said signal for optical modulation and compensating the voltage level of said drive signal to be constant.

2. The drive circuit of a semiconductor optical modulator according to claim 1, wherein said output circuit comprises a differential amplifier for receiving a signal for optical modulation and a reference voltage so as to generate the drive voltage and outputting said drive voltage to said semiconductor optical modulator.

3. The drive of a semiconductor optical modulator according to claim 1, wherein said compensation circuit comprises a differential amplifier for receiving a signal for optical modulation and reference voltage, bypassing a current passing through said semiconductor optical modulator in accordance with said signal for optical modulation, and regulating the drive voltage from said output circuit.

4. The drive circuit of a semiconductor optical modulator according to claim 1, wherein said output circuit and said compensation circuit are formed of compound semiconductor integrated circuits.

5. The drive circuit of a semiconductor optical modulator according to claim 1, wherein said output circuit includes:

a first load element connected to a first power supply line;

a first transistor with the drain thereof connected to said first power supply line;

a second transistor with the drain thereof connected to another end of the first load element and one end of a semiconductor optical modulator, respectively, and with the source thereof connected to the source of said first transistor; and a third transistor with the drain thereof connected to respective sources of said first and second transistors and with the source thereof connected to a second power supply line, respectively; and said compensation circuit includes:

a fourth transistor with the gate thereof connected to the gate of said second transistor and with the drain thereof connected to the drain of said second transistor, respectively;

a second load element connected to said first power supply line at one end thereof;

a fifth transistor with the drain thereof connected to another end of the second load element and with the source thereof connected to the source of said fourth transistor; and a sixth transistor with the drain thereof connected to respective sources of said fourth and fifth transistors and with the source thereof connected to a second power supply line, respectively.

6. The drive circuit of a semiconductor optical modulator according to claim 5, wherein:

reference voltage for optical modulation is supplied to respective gates of said first and fifth transistors;

a signal for optical modulation is supplied to respective gates of said second and fourth transistors; and bias voltage determining a working current of the circuit is supplied to respective gates of said third and sixth transistors, respectively.

7. The drive circuit of a semiconductor optical modulator according to claim 5, wherein the gate width of said fifth transistor is made narrower than the gate width of the fourth transistor.

8. The drive circuit of a semiconductor optical modulator according to claim 1, wherein for driving said semiconductor optical modulator of a modulator-integrate distributed-feedback laser diode in which said semiconductor optical modulator and a semiconductor laser diode having an active layer put between a semiconductor layer of one conduction type and a semiconductor layer of a reverse conduction type are integrated on a common substrate.

9. A circuit for driving a semiconductor optical modulator which has a first semiconductor layer having a first conduction type, a second semiconductor layer having a second conduction type, and a modulation active layer sandwiched with said first and second semiconductor layers, wherein said semiconductor optical modulator modulates light emission from a semiconductor laser diode having at least a third semiconductor layer having the first conduction type, the third semiconductor layer being electrically connected to the first semiconductor layer of said semiconductor optical modulator, the driving circuit comprising:

a differential amplifier for outputting a difference signal in accordance with a first control signal for optical modulation of said semiconductor optical modulator and a second control signal obtained by inverting said first control signal; and an output circuit for generating drive voltage in accordance with a difference signal from said differential amplifier and outputting said drive voltage to said semiconductor optical modulator.

10. The drive circuit of a semiconductor optical modulator according to claim 9, wherein said differential amplifier and said output circuit are formed of compound semiconductor integrated circuits.

11. The drive circuit of a semiconductor optical modulator according to claim 9, wherein said differential amplifier includes:

a first level shifter connected to a first power supply line at one end thereof;

a first and a second resistance elements connected to another end of said first level shifter at one end of each element, respectively;

a first transistor with the drain thereof connected to another end of said first resistance element;

a second transistor with the drain thereof connected to another end of said second resistance element; and a third transistor with the drain thereof connected to respective sources of said first and second transistors and with the source thereof connected to a second power supply line; and said output circuit includes:

a fourth transistor with the drain thereof connected to said first power supply line and with the gate thereof connected to the drain of said second transistor;

a second level shifter connected to the source of said fourth transistor at one end thereof; and a fifth transistor with the drain thereof connected to another end of said second level shifter and one end of said semiconductor optical modulator and with the gate and source thereof connected to a second power supply line, respectively.

12. The drive circuit of a semiconductor optical modulator according to claim 9, wherein a first control signal is supplied to the gate of said first transistor, a second control signal is supplied to the gate of said second transistor, and bias voltage determining a working current of the circuit is supplied to the gate of said third transistor.

13. The drive circuit of a semiconductor optical modulator according to claim 9, wherein said second resistance element is formed of a field effect transistor, and the resistance value of said second resistance element is regulated by control voltage supplied from the outside.

14. The drive circuit of a semiconductor optical modulator according to claim 9, wherein for driving said semiconductor optical modulator of a modulator-integrate distributed-feedback laser diode in which said semiconductor optical modulator and a semiconductor laser diode having an active layer put between a semiconductor layer of one conduction type and a semiconductor layer of a reverse conduction type are integrated on a common substrate.

15. A circuit for driving a semiconductor optical modulator which has a first semiconductor layer having a first conduction type, a second semiconductor layer having a second conduction type, and a modulation active layer sandwiched with said first and second semiconductor layers, wherein said semiconductor optical modulator modulates light emission from a semiconductor laser diode having at least a third semiconductor layer having the first conduction type, the third semiconductor layer being electrically connected to the first semiconductor layer of said semiconductor optical modulator, the driving circuit comprising:

a differential amplifier for outputting a first and a second difference signals in accordance with a first control signal for optical modulation of said semiconductor optical modulator and a second control signal obtained by inverting said first control signal;

a first source follower circuit for outputting a non-inverted output signal in accordance with a first difference signal from said differential amplifier;

a second source follower circuit for outputting an inverted output signal in accordance with a second difference signal from said differential amplifier; and a push-pull circuit for generating drive voltage in accordance with a non-inverted output signal from said first source follower circuit and an inverted output signal from said second source follower circuit, and outputting said drive voltage to said semiconductor optical modulator.

16. The drive circuit of a semiconductor optical modulator according to claim 15, wherein said differential amplifier, first and second source follower circuits and push-pull circuit are formed of compound semiconductor integrated circuits.

17. The drive circuit of a semiconductor optical modulator according to claim 15, wherein said differential amplifier includes:

a first level shifter connected to a first power supply line at one end thereof;

a first and a second resistance elements connected to another end of said first level shifter at one end of each element, respectively;

a first transistor with the drain thereof connected to another end of said first resistance element;

a second transistor with the drain thereof connected to another end of said second resistance element; and a third transistor with the drain thereof connected to respective sources of said first and second transistors and with the source thereof connected to a second power supply line, respectively; and said first source follower circuit includes:

a fourth transistor with drain thereof connected to a first power supply line and with the gate thereof connected to the drain of said first transistor, respectively;

a second level shifter connected to the source of said fourth transistor at one end thereof; and a fifth transistor with the drain thereof connected to another end of said second level shifter and with the gate and source thereof connected to a second power supply line; and said second source follower circuit includes:

a sixth transistor with the drain thereof connected to the first power supply line and with the gate thereof connected to the drain of said second transistor, respectively;

a third level shifter connected to the source of said sixth transistor at one end thereof; and a seventh transistor with the drain thereof connected to another end of said third level shifter and with the gate and source thereof connected to the second power supply line; and said push-pull circuit includes:

an eighth transistor with the drain thereof connected to the first power supply line and with the gate thereof connected to the source of said sixth transistor, respectively;

a fourth level shifter connected to the source of said eighth transistor at one end thereof; and a ninth transistor with the drain thereof connected to another end of said fourth level shifter and one end of the semiconductor optical modulator, with the gate thereof connected to the drain of said fifth transistor and with the source thereof connected to the second power supply line.

18. The drive circuit of a semiconductor optical modulator according to claim 15, wherein a first control signal is supplied to the gate of said first transistor, a second control signal is supplied to the gate of said second transistor, and bias voltage determining a working current of the circuit is supplied to the gate of said third transistor.

19. The drive circuit of a semiconductor optical modulator according to claim 15, wherein said first and second resistance elements are formed of field effect transistors, and resistance values of said first and second resistance elements are regulated by control voltage supplied from the outside.

20. The drive circuit of a semiconductor optical modulator according to claim 15, wherein said second level shifter is formed of a field effect transistor, and the resistance value of said second level shifter is regulated by the control voltage supplied from the outside.

21. The drive circuit of a semiconductor optical modulator according to claim 15, wherein for driving said semiconductor optical modulator of a modulator-integrate distributed-feedback laser diode in which said semiconductor optical modulator and a semiconductor laser diode having an active layer put between a semiconductor layer of one conduction type and a semiconductor layer of a reverse conduction type are integrated on a common substrate.

22. A circuit for driving a semiconductor optical modulator which has a first semiconductor layer having a first conduction type, a second semiconductor layer having a second conduction type, and a modulation active layer sandwiched with said first and second semiconductor layers, wherein said semiconductor optical modulator modulates light emission from a semiconductor laser diode having at least a third semiconductor layer having the first conduction type, the third semiconductor layer being electrically connected to the first semiconductor layer of said semiconductor optical modulator, the driving circuit comprising:

a first source follower circuit for outputting a non-inverted output signal and an inverted output signal in accordance with a first control signal for optical modulation of said semiconductor optical modulator;

a second source follower circuit for outputting a non-inverted output signal and an inverted output signal in accordance with a second control signal obtained by inverting said first control signal;

a first differential amplifier for outputting first voltage in accordance with respective non-inverted output signals from said first and second source follower circuits;

a second differential amplifier for outputting second voltage in accordance with respective inverted output signals from said first and second source follower circuits; and a push-pull circuit for generating drive voltage in accordance with the first and the second voltages from said first and second differential amplifiers, and outputting said drive voltage to said semiconductor optical modulator.

23. The drive circuit of a semiconductor optical modulator according to claim 22, wherein said first and second source follower circuits, said first and second differential amplifiers and said push-pull circuit are formed of compound semiconductor integrated circuits.

24. The drive circuit of a semiconductor optical modulator according to claim 22, wherein said first source follower circuit includes:

a first transistor with the drain thereof connected to a first power supply line;

a first level shifter connected to the source of said first transistor at one end thereof; and a second transistor with the drain thereof connected to another end of said first level shifter and with the gate and source thereof connected to a second power supply line; and said second source follower circuit includes:
a third transistor with the drain thereof connected to the first power supply line;
a second level shifter connected to the source of said third transistor at one end thereof; and
a fourth transistor with the drain thereof connected to another end of said second level shifter and with the gate and source thereof connected to the second power supply line; and said first differential amplifier includes:

a third level shifter connected to said first power supply line at one end thereof;
a first and a second resistance elements connected to another end of said third level shifter at one end of each element, respectively;
a fifth transistor with the drain thereof connected to another end of said first resistance element and with the gate thereof connected to the source of said first transistor, respectively;
a sixth transistor with the drain thereof connected to another end of said second resistance element and with the gate thereof connected to the source of said third transistor, respectively; and p1 a seventh transistor with the drain thereof connected to respective sources of said fifth and sixth transistors and with the source thereof connected to the second power supply line, respectively; and said second differential amplifier includes:

a fourth level shifter connected to said second power supply line at one end thereof;
a third and a fourth resistance elements connected to another end of said fourth level shifter at one end of each element, respectively;
an eighth transistor with the source thereof connected to another end of said third resistance element and with the gate thereof connected to the drain of said second transistor, respectively;
a ninth transistor with the source thereof connected to another end of said fourth resistance element and with the gate thereof connected to the drain of said fourth transistor, respectively; and
a tenth transistor with the source thereof connected to respective drains of said eighth and ninth transistors and with the drain thereof connected to said first power supply line; and said push-pull circuit includes:

an 11th transistor with the drain thereof connected to the first power supply line and with the gate thereof connected to the drain of said sixth transistor, respectively;
a fifth level shifter connected to the source of said 11th transistor at one end thereof; and
a 12th transistor with the drain thereof connected to another end of said fifth level shifter and one end of said semiconductor optical modulator and with the gate thereof connected to the source of said ninth transistor, respectively.

25. The drive circuit of a semiconductor optical modulator according to claim 22, wherein a first control signal is supplied to the gate of said first transistor, a second control signal is supplied to the gate of said third transistor, and bias voltage determining a working current of the circuit is supplied to respective gates of said seventh and tenth transistors.

26. The drive circuit of a semiconductor optical modulator according to claim 22, wherein said second and fourth resistance elements are formed of field effect transistors, and resistance values of said second and fourth resistance elements are made variable by the control voltage supplied from the outside.

27. The drive circuit of a semiconductor optical modulator according to claim 22, wherein said first and second level shifters are formed of field effect transistors, and the resistance values of said first and second level shifters are regulated by the control voltage supplied from the outside.

28. The drive circuit of a semiconductor optical modulator according to claim 22, wherein for driving said semiconductor optical modulator of a modulator-integrate distributed-feedback laser diode in which said semiconductor optical modulator and a semiconductor laser diode having an active layer put between a semiconductor layer of one conduction type and a semiconductor layer of a reverse conduction type are integrated on a common substrate.

29. An electric signal to light conversion apparatus for converting an electric signal into light for communication, comprising:

a semiconductor laser diode for generating laser light;

a semiconductor optical modulator for modulating the output light of said semiconductor laser diode; and a drive circuit for outputting drive voltage to said semiconductor optical modulator; wherein said drive circuit is composed of:

an output circuit for outputting said drive voltage to said semiconductor optical modulator based on a signal for optical modulation inputted from the outside; and a compensation circuit for regulating a resistance of bypass channel of current passing in said semiconductor optical modulator by said drive voltage of said output circuit based on said signal for optical modulation and compensating a level of said drive voltage to be constant.

\* \* \* \* \*